(12) United States Patent
    Tsurusaki

(10) Patent No.: US 10,159,146 B2
(45) Date of Patent: Dec. 18, 2018

(54) INPUT APPARATUS, DISPLAY APPARATUS, AND ELECTRONIC APPARATUS

(71) Applicant: KYOCERA Corporation, Kyoto-shi, Kyoto (JP)

(72) Inventor: Kouji Tsurusaki, Kirishima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 16 days.

(21) Appl. No.: 14/373,252

(22) PCT Filed: Dec. 27, 2012

(86) PCT No.: PCT/JP2012/083906
§ 371 (c)(1),
(2) Date: Jul. 18, 2014

(87) PCT Pub. No.: WO2013/108564
PCT Pub. Date: Jul. 25, 2013

(65) Prior Publication Data
US 2015/0002761 A1    Jan. 1, 2015

(30) Foreign Application Priority Data
Jan. 18, 2012  (JP) .................................. 2012-008116

(51) Int. Cl.
*H05K 1/02*       (2006.01)
*G06F 3/044*      (2006.01)
(Continued)

(52) U.S. Cl.
CPC ......... *H05K 1/0271* (2013.01); *G06F 1/1643* (2013.01); *G06F 3/044* (2013.01);
(Continued)

(58) Field of Classification Search
CPC ......... G02F 1/133512; G02F 1/136209; G02F 2001/133388; G02F 1/13338; G06F 3/044;
(Continued)

(56) References Cited

U.S. PATENT DOCUMENTS 6,814,452 B2 * 11/2004 Kusuda .................. G02F 1/133
                                                          359/609
7,061,567 B2 *  6/2006 Murade ............. G02F 1/133512
                                                          349/110
(Continued)

FOREIGN PATENT DOCUMENTS

JP    2008-197913    8/2008
JP    2010-039621    2/2010
(Continued)

OTHER PUBLICATIONS

Japanese Office Action with concise English explanation, Japanese Patent Application No. 2013-554224, dated Oct. 27, 2015, 5 pgs.
(Continued)

*Primary Examiner* — Michael J Jansen, II
(74) *Attorney, Agent, or Firm* — Volpe and Koenig, P.C.

(57) ABSTRACT

[Object] To provide an input device, a display device, and a mobile terminal which can reduce a possibility that at least a connection portion in detection wiring may be viewed by a user while making the thickness of a light shielding layer relatively small.
[Solution] An input device X1 includes a base 2 which includes a first main face 2a and a second main face 2b located on a side opposite to the first main face 2a; a first detection electrode pattern 3 on the second main face 2b of the base 2; detection wiring 8 on the second main face 2b of the base 2 and including a connection portion 8a connected to the first detection electrode pattern 3; a first light shielding layer 6 on the first main face 2a or the second main face 2b
(Continued)

of the base 2, and located on the first main face 2a side of the base 2 as compared to the detection wiring 8; and a second light shielding layer 11 on the first main face 2a or the second main face 2b of the base 2, in which the first light shielding layer 6 has a first region which overlaps with the second light shielding layer 11 in plan view, and at least the connection portion 8a in the detection wiring 8 is located by being overlapped with the first region in plan view.

11 Claims, 23 Drawing Sheets

(51) Int. Cl.
    *G06F 1/16*         (2006.01)
    *H05K 1/03*         (2006.01)

(52) U.S. Cl.
    CPC . *H05K 1/0306* (2013.01); *H05K 2201/10128* (2013.01); *H05K 2201/10151* (2013.01)

(58) Field of Classification Search
    CPC .................. G06F 3/0412; G06F 3/041; G06F 2203/04103; G06F 3/0416; G06F 3/047; G06F 2203/04107; G06F 1/1643; G09G 2300/0426; H05K 1/0271; H05K 1/0306; H05K 2201/10128; H05K 2201/10151
    See application file for complete search history.

(56) References Cited

U.S. PATENT DOCUMENTS

| | | | | |
|---|---|---|---|---|
| 7,292,290 B2* | 11/2007 | Miyagawa | ............ | G06F 1/1601 349/58 |
| 8,259,252 B2* | 9/2012 | Oohira | ............. | G02F 1/133308 349/58 |
| 8,587,533 B2* | 11/2013 | Nishihara | ............. | G06F 3/0416 345/173 |
| 8,659,560 B2* | 2/2014 | Nagata | .................... | G06F 3/044 178/18.01 |
| 8,692,787 B2* | 4/2014 | Imazeki | .................. | G06F 3/044 345/173 |
| 8,704,762 B2* | 4/2014 | Anno | ...................... | G06F 3/041 345/156 |
| 8,723,046 B2* | 5/2014 | Hashimoto | ............. | G06F 3/044 174/250 |
| 8,736,576 B2* | 5/2014 | Hayakawa | ............. | G06F 3/044 345/174 |
| 8,952,903 B2* | 2/2015 | Ho | .......................... | G06F 3/044 178/18.01 |
| 9,007,309 B2* | 4/2015 | Hinata | .................... | G06F 3/045 345/173 |
| 9,081,434 B2* | 7/2015 | Imazeki | .................. | G06F 3/044 |
| 9,134,867 B2* | 9/2015 | Misaki | .................... | G06F 3/044 |
| 9,151,978 B2* | 10/2015 | Tsurusaki | ................ | G06F 3/041 |
| 9,213,450 B2* | 12/2015 | Ippel | ...................... | G06F 3/044 |
| 9,274,631 B2* | 3/2016 | Anno | ...................... | G06F 3/041 |
| 9,507,476 B2* | 11/2016 | Imazeki | .................. | G06F 3/044 |
| 9,817,478 B2* | 11/2017 | Nakamura | ............. | G06F 3/016 |
| 2003/0076459 A1* | 4/2003 | Murade | ............. | G02F 1/133512 349/111 |
| 2003/0090803 A1* | 5/2003 | Kusuda | .................. | G02F 1/133 359/601 |
| 2005/0286008 A1* | 12/2005 | Miyagawa | ............ | G06F 1/1601 349/158 |
| 2008/0246741 A1* | 10/2008 | Hinata | .................... | G06F 3/045 345/173 |
| 2010/0123675 A1* | 5/2010 | Ippel | ...................... | G06F 3/0412 345/173 |
| 2010/0141608 A1* | 6/2010 | Huang | .................... | G06F 3/044 345/178 |
| 2010/0171718 A1* | 7/2010 | Denda | ...................... | G06F 3/044 345/173 |
| 2010/0220071 A1* | 9/2010 | Nishihara | ............. | G06F 3/0416 345/173 |
| 2010/0245706 A1* | 9/2010 | Oohira | .............. | G02F 1/133308 349/58 |
| 2011/0032207 A1* | 2/2011 | Huang | .................... | G06F 3/044 345/174 |
| 2011/0074730 A1* | 3/2011 | Nagata | .................... | G06F 3/044 345/174 |
| 2011/0109590 A1 | 5/2011 | Park | | |
| 2011/0227846 A1* | 9/2011 | Imazeki | .................. | G06F 3/044 345/173 |
| 2011/0227867 A1* | 9/2011 | Ogawa | .................... | G06F 3/041 345/174 |
| 2012/0092292 A1* | 4/2012 | Hayakawa | ............. | G06F 3/044 345/174 |
| 2012/0139829 A1 | 6/2012 | Anno et al. | | |
| 2012/0235927 A1* | 9/2012 | Ho | .......................... | G06F 3/044 345/173 |
| 2013/0000954 A1* | 1/2013 | Hashimoto | ............. | G06F 3/044 174/250 |
| 2013/0057501 A1* | 3/2013 | Nagata | .................... | G06F 3/016 345/173 |
| 2013/0249863 A1* | 9/2013 | Misaki | .................... | G06F 3/044 345/174 |
| 2014/0028931 A1* | 1/2014 | Tsurusaki | ................ | G06F 3/041 349/12 |
| 2014/0176832 A1* | 6/2014 | Imazeki | .................. | G06F 3/044 349/12 |
| 2014/0225849 A1* | 8/2014 | Anno | ...................... | G06F 3/041 345/173 |
| 2014/0362309 A1* | 12/2014 | Tsurusaki | ................ | G06F 3/044 349/12 |
| 2015/0002761 A1* | 1/2015 | Tsurusaki | .............. | G06F 1/1643 349/12 |
| 2015/0212579 A1* | 7/2015 | Nakamura | ............ | G06F 1/1626 345/173 |
| 2015/0268767 A1* | 9/2015 | Imazeki | .................. | G06F 3/044 345/174 |
| 2015/0301640 A1* | 10/2015 | Tsurusaki | ................ | G06F 3/041 345/175 |
| 2015/0301669 A1* | 10/2015 | Miyazaki | ................ | G06F 3/044 345/173 |

FOREIGN PATENT DOCUMENTS

| | | |
|---|---|---|
| JP | 2011-090443 | 5/2011 |
| JP | 2011-526023 A | 9/2011 |
| JP | 2011-253359 | 12/2011 |

OTHER PUBLICATIONS

International Search Report (Form PCT/ISA/210) dated Apr. 9, 2013 issued for PCT/JP2012/083906.

* cited by examiner

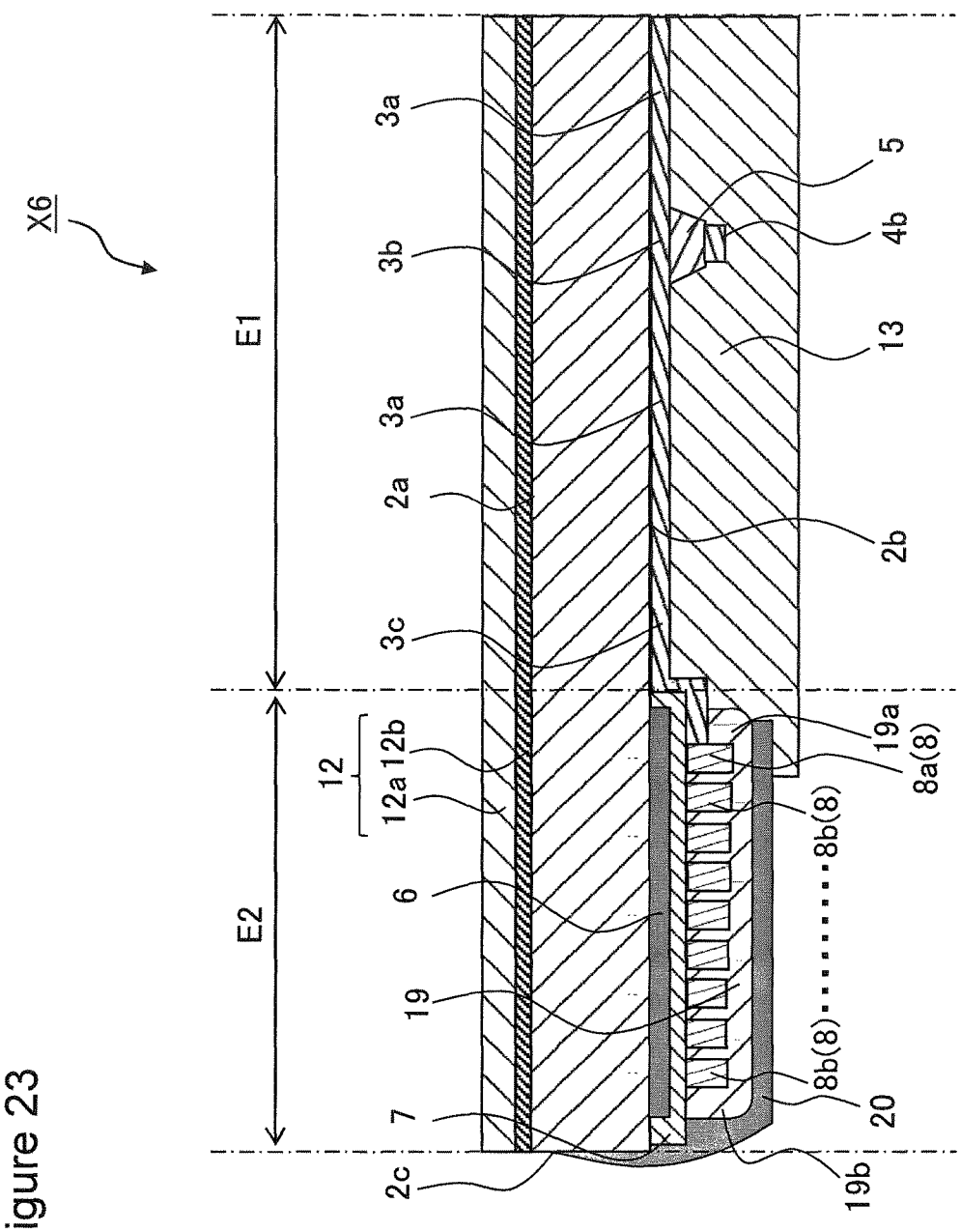

INPUT APPARATUS, DISPLAY APPARATUS, AND ELECTRONIC APPARATUS

TECHNICAL FIELD

The present invention relates to an input device, a display device, and an electronic apparatus.

BACKGROUND ART

As an input device, for example, a capacitive touch panel which detects an input position on the basis of changes in capacitance between a finger and a detection electrode has been known.

Such input device has an input region and a non-input region, and a detection electrode pattern is provided on a base corresponding to the input region. In addition, a light shielding layer is provided on the base corresponding to the non-input region. In addition, detection wiring which includes a connection portion which is connected to the detection electrode pattern is provided on the light shielding layer (for example, refer to PTL 1).

CITATION LIST

Patent Literature

PTL 1: Japanese Unexamined Patent Application Publication No. 2011-90443

SUMMARY OF INVENTION

Technical Problem

However, in the above described input device, since constituent materials of the base and the light shielding layer are different from each other, there is a difference in coefficient of thermal expansion. For this reason, for example, when the input device is incorporated in a display device, there is a possibility that an internal stress occurs in the light shielding layer due to heat which is transmitted to the input device from a backlight of the display device, and the light shielding layer may be separated from the base. In order to reduce a possibility that the light shielding layer is separated from the base, it is necessary to make the thickness of the light shielding layer relatively small. Here, the input region in the input device is, for example, a region in which an image on a display panel which is arranged so as to face the input device is viewed. For this reason, the input region is a region where intensity of light input from the backlight is relatively large. Thus, even if the thickness of the light shielding layer is relatively small, there has been a possibility that the connection portion in the detection wiring which is located on the side close to the input region may be viewed by a user through the light shielding layer.

The present invention has been made by taking such a problem into consideration, and an object thereof is to provide an input device, a display device, and an electronic apparatus in which a possibility that at least a connection portion of detection wiring may be viewed by a user can be reduced, while making the thickness of a light shielding layer relatively small.

Solution to Problem

An input device according to an embodiment of the present invention includes: a base which includes a first main face, and a second main face located on a side opposite to the first main face; a detection electrode pattern on the second main face of the base; detection wiring on the second main face of the base and including a connection portion connected to the detection electrode pattern; a first light shielding layer on the first main face or the second main face of the base and located on the first main face side of the base as compared to the detection wiring; and a second light shielding layer on the first main face or the second main face of the base, in which the first light shielding layer has a first region which overlaps with the second light shielding layer in plan view, and at least the connection portion in the detection wiring is located by being overlapped with the first region in plan view.

A display device according to an embodiment of the present invention includes the input device according to the present invention; a display panel which is arranged so as to face the input device; and a housing which accommodates the display panel.

An electronic apparatus according to an embodiment of the present invention includes the display device according to the present invention.

Advantageous Effects of Invention

An input device, a display device, and an electronic apparatus according to the present invention exhibit effects in which a possibility that at least a connection portion of detection wiring may be viewed by a user can be reduced, while making the thickness of a light shielding layer relatively small.

BRIEF DESCRIPTION OF DRAWINGS

FIG. 23 is a view illustrating another example of the input device according to the modification example 5, and is a view illustrating the same portion as that shown in FIG. 22.

DESCRIPTION OF EMBODIMENTS

Hereinafter, embodiments of the present invention will be described with reference to the drawings.

However, each diagram which will be referred to below is a diagram in which main members necessary for describing the present invention are illustrated by being simplified, for ease of description, among constituent elements of an embodiment of the present invention. Accordingly, the input device, the display device, and the electronic apparatus according to the present invention can include any constituent member which is not illustrated in each diagram which is referred to in the specification.

Figure 1:
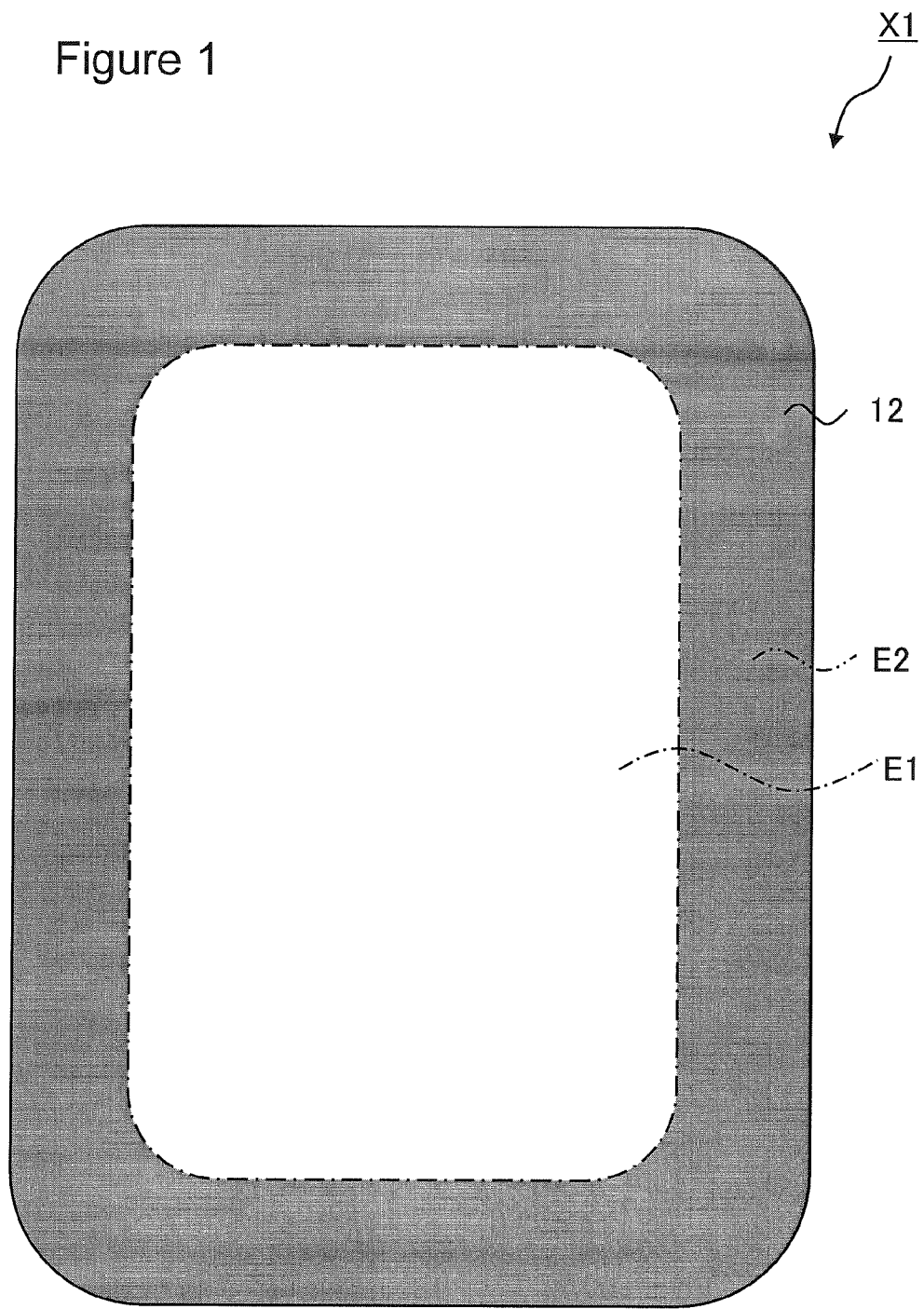
FIG. 1 is a plan view illustrating a schematic configuration of an input device according to an embodiment.

As illustrated in FIG. 1, an input device X1 according to the embodiment is a projected capacitive touch panel, and includes an input region E1 in which an input operation by a user is possible, and a non-input region E2 which is located outside the input region E1. In addition, the non-input region E2 may be located inside the input region E1. In addition, the input device X1 is not limited to the projected capacitive touch panel, and may be an surface capacitive touch panel, or a resistive touch panel, for example.

In addition, according to the embodiment, the input device X1 is a capacitive touch panel on which cover glass is integrated, however, not limited thereto. The input device X1 may be a laminated capacitive touch panel, or an on-cell type capacitive touch panel, for example.

As illustrated in FIGS. 1 to 5, the input device X1 includes a base 2.

Figure 2:
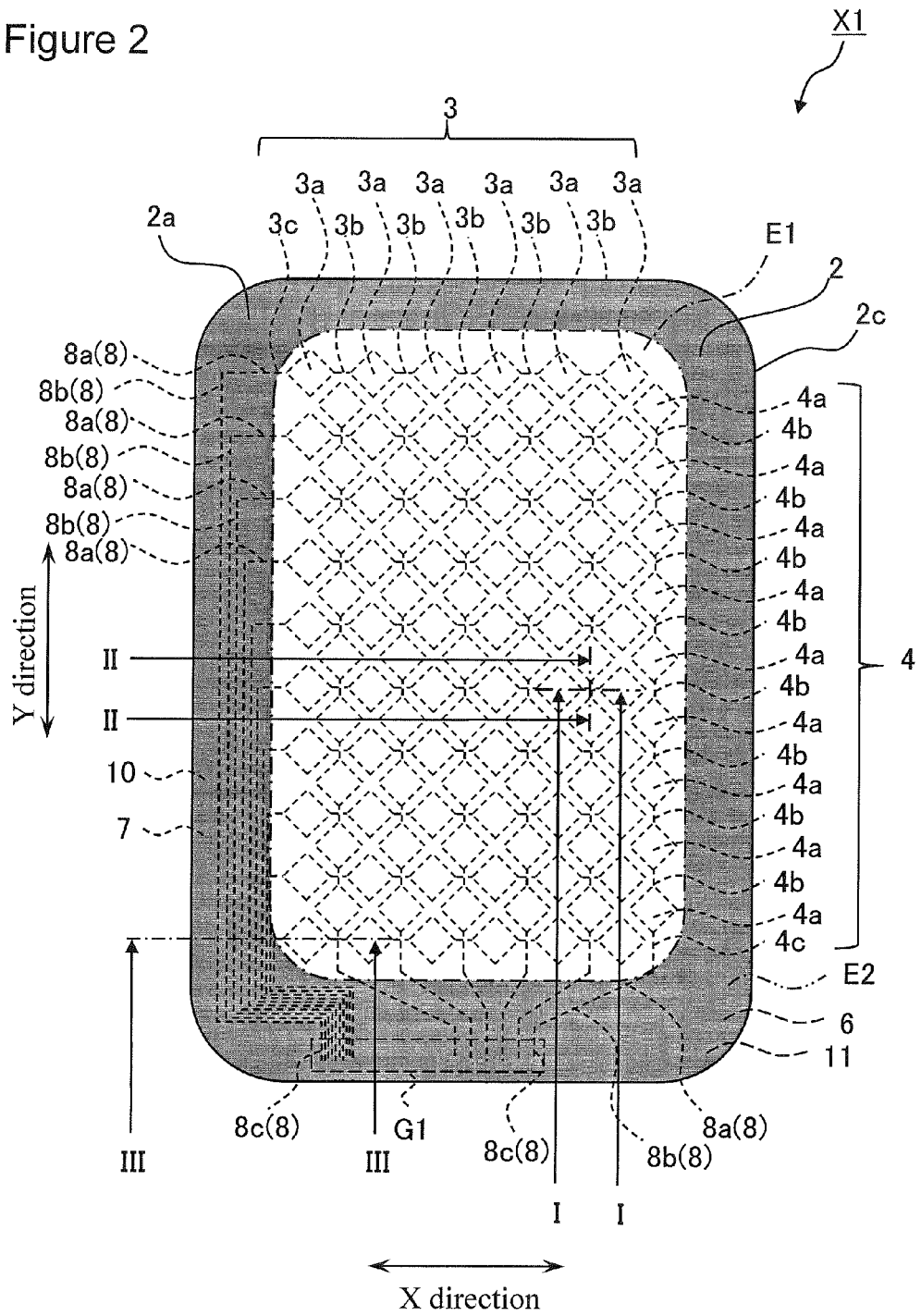
FIG. 2 is a plan view illustrating the schematic configuration of the input device according to the embodiment, and is a view seen through a base.
Figure 3:
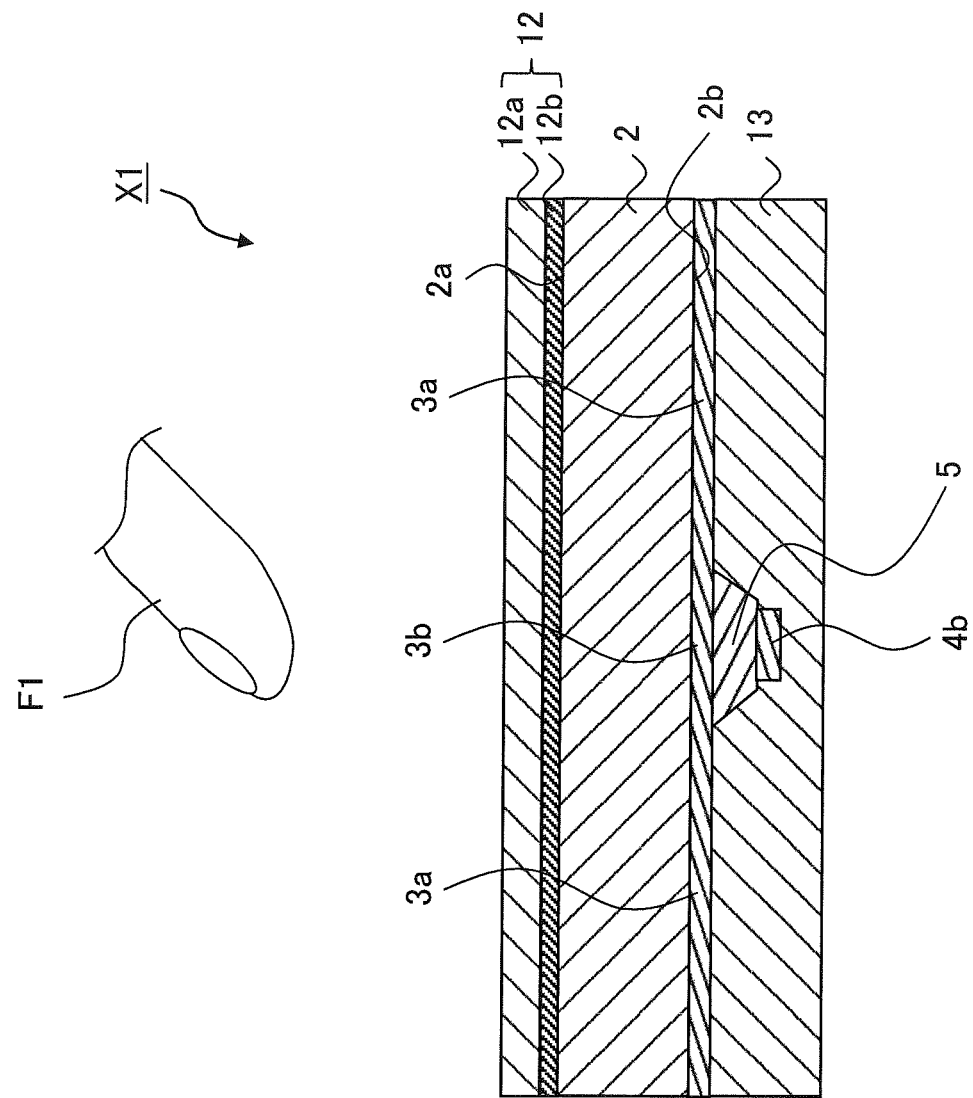
FIG. 3 is a cross-sectional view taken along line I-I illustrated in FIG. 2.
Figure 4:
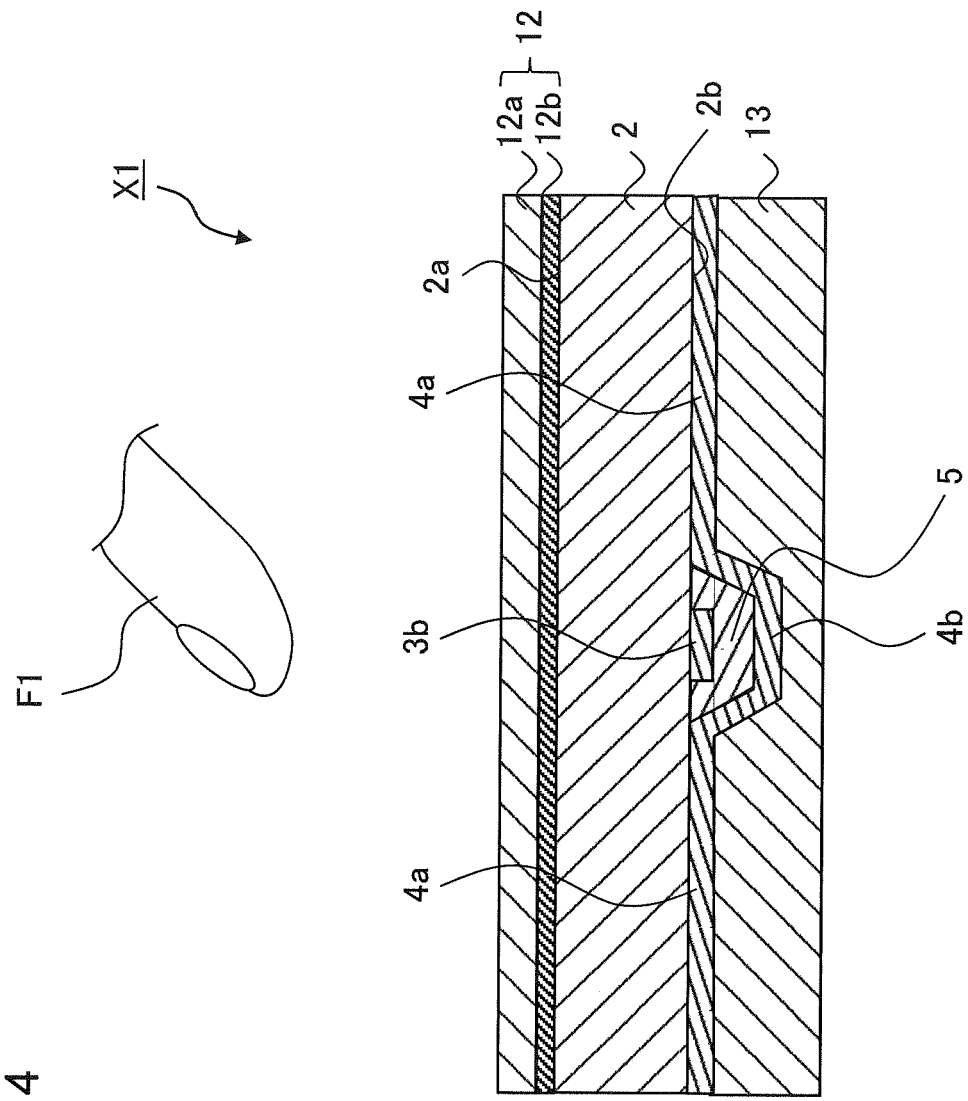
FIG. 4 is a cross-sectional view taken along line II-II illustrated in FIG. 2.

The base 2 supports a first detection electrode pattern 3, a second detection electrode pattern 4, an insulator 5, a first light shielding layer 6, a first insulating layer 7, detection wiring 8, a second insulating layer 10, a second light shielding layer 11, a first protection member 12, and a second protection member 13. In addition, in FIG. 2, illustrations of the insulator 5, the first protection member 12, and the second protection member 13 are omitted for ease of description.

The base 2 includes a first main face 2a, a second main face 2b, and an end face 2c. The first main face 2a is located on the user side as compared to the second main face 2b. The second main face 2b is located on the opposite side of the first main face 2a. The end face 2c is located between the first main face 2a and the second main face 2b. According to the embodiment, an external shape of the base 2 is approximately rectangular in plan view. For this reason, there are four end faces 2c corresponding to four sides of the base 2 in plan view. In addition, an external shape of the base 2 may be approximately polygonal, or circular in plan view.

The base 2 is an insulative base. The base 2 is translucent with respect to light input in a direction which intersects the first main face 2a and the second main face 2b. In addition, "translucency" in the specification means a property of transmitting a part, or all of visible light beams.

According to the embodiment, a constituent material of the base 2 is glass. In particular, it is preferable that the material be glass subjected to chemical strengthening using ion exchange, in order to improve strength. Here, when the base 2 is glass which is subjected to the chemical strengthening, a layer which is subjected to the chemical strengthening is also included in the base 2. In addition, as the constituent material of the base 2, plastic may also be adopted instead of glass.

A first detection electrode pattern 3 generates electrostatic capacitance between the first detection electrode pattern 3 and a finger F1 of a user who accesses the first main face 2a of the base 2 corresponding to the input region E1, and detects an input position in a long side direction (Y direction in FIG. 2) of the base 2 in plan view. A plurality of first detection electrode patterns 3 are provided in parallel on the second main face 2b of the base 2 corresponding to the input region E1 in the Y direction. In addition, the first detection electrode pattern 3 includes a first detection electrode 3a, first interelectrode wiring 3b, and first connection wiring 3c.

The first detection electrode 3a generates electrostatic capacitance between the first detection electrode and the finger F1 of a user. A plurality of the first detection electrodes 3a are provided in parallel in a short side direction (X direction in FIG. 2) in plan view. The first interelectrode wiring 3b electrically connects the first detection electrodes 3a to each other. The first interelectrode wiring 3b is provided between first detection electrodes 3a which are adjacent to each other. The first connection wiring 3c connects the first detection electrode 3a and the detection wiring 8. The first connection wiring 3c is connected to the first detection electrode 3a located on the side close to the non-input region E2 (left side on sheet in FIG. 2) on the second main face 2b of the base 2 corresponding to the input region E1. In addition, the first connection wiring 3c is connected to a connection portion 8a of the detection wiring 8 on the first light shielding layer 6 corresponding to the non-input region E2. In this manner, the first connection wiring 3c is located over regions of the input region E1 and the non-input region E2.

A second detection electrode pattern 4 generates electrostatic capacitance between the second detection electrode pattern and the finger F1 of a user which accesses the first main face 2a of the base 2 corresponding to the input region E1, and detects an input position in the X direction. A plurality of second detection electrode patterns 4 are provided in parallel on the second main face 2b of the base 2 corresponding to the input region E1 in the X direction. In addition, the second detection electrode pattern 4 includes a second detection electrode 4a, second interelectrode wiring 4b, and second connection wiring 4c.

The second detection electrode 4a generates electrostatic capacitance between the second detection electrode and the finger F1 of a user. A plurality of the second detection electrodes 4a are provided in parallel in the Y direction. The second interelectrode wiring 4b electrically connects the second detection electrodes 4a to each other. The second interelectrode wiring 4b is located between the second detection electrodes 4a which are adjacent to each other, and is provided on the insulator 5 over the insulator 5 so as to be electrically insulated from the first interelectrode wiring 3b. Here, the insulator 5 is provided on the second main face 2b of the base 2 so as to cover the first interelectrode wiring 3b. As a constituent material of the insulator 5, a transparent resin such as an acrylic resin, an epoxy resin, a silicone resin, silicon dioxide, or silicon nitride is used, for example. The second connection wiring 4c connects the second detection electrode 4a and the detection wiring 8. The second connection wiring 4c is connected to the second detection electrode 4a located on the side close to the non-input region E2 (lower side on sheet in FIG. 2) on the second main face 2b of the base 2 corresponding to the input region E1. In addition, the second connection wiring 4c is connected to the connection portion 8a of the detection wiring 8 on the first light shielding layer 6 corresponding to the non-input region E2. In this manner, the second connection wiring 4c is located across regions of the input region E1 and the non-input region E2.

In addition, according to the embodiment, the first detection electrode 3a and the second detection electrode 4a are approximately diamond shaped in plan view, however, not limited thereto, and may be polygonal shapes or circular shapes. When the first detection electrode 3a and the second detection electrode 4a are approximately diamond shaped in plan view, it is possible to make a gap between the first detection electrodes 3a, and between the second detection electrodes 4a small. As a result, it is possible to make areas of the first detection electrode 3a and the second detection electrode 4a which are provided on the second main face 2b of the base 2 relatively large. For this reason, it is possible to make electrostatic capacitance which is generated between the first detection electrode 3a and the finger F1, and between the second detection electrode 4a and the finger F1 large, and to improve a detection sensitivity of the input device X1.

In addition, according to the embodiment, the first detection electrode pattern 3 includes the first detection electrode 3a and the first interelectrode wiring 3b, however, not limited thereto. The first detection electrode pattern 3 may be configured of rectangular electrode patterns which are located along the X direction, for example. In addition, according to the embodiment, the second detection electrode pattern 4 includes the second detection electrode 4a and the second interelectrode wiring 4b, however, not limited thereto, and the second detection electrode pattern 4 may be configured of rectangular electrode patterns which are located along the Y direction, for example.

As constituent materials of the above described first detection electrode pattern 3 and the second detection electrode pattern 4, a translucent conductive member is used. As the translucent conductive member, Indium Tin Oxide (ITO), Indium Zinc Oxide (IZO), Al-Doped Tin Oxide (ATO), tin oxide, zinc oxide, or a conductive polymer is used. In addition, at least a part of the first detection electrode pattern 3 and the second detection electrode pattern 4 may be configured of thin metallic wires. As a constituent material of the thin metallic wire, a metallic material such as aluminum, silver, gold, or an alloy of these is used, for example.

As a method of forming the first detection electrode pattern 3 and the second detection electrode pattern 4, for example, the above described materials are formed on the second main face 2b of the base 2 as a film, using a sputtering method, an evaporation method, or a Chemical Vapor Deposition (CVD) method. In addition, by applying a photosensitive resin onto the surface of the film, and by patterning the film after exposing, developing, and etching, the first detection electrode pattern 3 and the second detection electrode pattern 4 are formed.

The first light shielding layer 6 shields light which is input in a direction intersecting the first main face 2a and the second main face 2b of the base 2. In addition, "shielding" in the specification means that a part or all of visible light beams is shielded by reflection or absorption. The first light shielding layer 6 is located on the second main face 2b of the base 2. The first light shielding layer 6 is located on the first main face 2a side of the base 2 as compared to the detection wiring 8. According to the embodiment, the first light shielding layer 6 is provided on the second main face 2b of the base 2 corresponding to the entire non-input region E2. Accordingly, the first light shielding layer 6 can shield the entire region on the base 2 corresponding to the non-input region E2. In addition, the first light shielding layer 6 may not be provided in the entire region corresponding to the non-input region E2, on the second main face 2b of the base 2, and may be provided at a part of region corresponding to the non-input region E2. In addition, the first light shielding layer 6 may be provided on the first main face 2a of the base 2 corresponding to the non-input region E2.

As a constituent material of the first light shielding layer 6, a resin material including a coloring material is used. As the resin material, an acrylic resin, an epoxy resin, or silicon oxide is used, for example. As the coloring material, carbon, titanium, or chromium is used, for example. In addition, the first light shielding layer 6 is not limited to a black color, and may be colored other than black. As a method of forming the first light shielding layer 6, there is a screen printing method, a sputtering method, a CVD method, or an evaporation method in the related art which are known, for example.

The first insulating layer 7 protects the first light shielding layer 6 from corrosion due to absorption of moisture in the atmosphere. In addition, the first insulating layer 7 electrically insulates the first light shielding layer 6 and the detection wiring 8. The first insulating layer 7 is provided on the second main face 2b of the base 2 corresponding to the non-input region E2. According to the embodiment, the first insulating layer 7 covers the first light shielding layer 6. Accordingly, it is possible to reduce a possibility that the first light shielding layer 6 corrodes due to absorption of moisture in the atmosphere. As a constituent material of the first insulating layer 7, an acrylic resin, an epoxy resin, silicon dioxide, silicon nitride, or the like is used, for example. As a method of forming the first insulating layer 7, for example, there is a transfer printing method, a spin coat method, or a slit coat method in the related art which is known.

The detection wiring 8 detects a change in electrostatic capacitance which is generated between the first detection electrode pattern 3 and the finger F1, or between the second detection electrode pattern 4 and the finger F1. The detection wiring 8 is provided on the second main face 2b of the base 2 corresponding to the non-input region E2. Specifically, the detection wiring 8 is provided on the first insulating layer 7.

For this reason, even if the coloring material included in the first light shielding layer 6 is conductive, it is possible to reduce a possibility that the first light shielding layer 6 and the detection wiring 8 are electrically connected. In addition, the first insulating layer 7 may not be provided, and the detection wiring 8 may be directly provided on the first light shielding layer 6. When the detection wiring 8 is directly provided on the first light shielding layer 6, it is preferable that the first light shielding layer 6 not be conductive.

The detection wiring 8 includes the connection portion 8a, a base portion 8b, and a lead-out portion 8c.

The connection portion 8a is a portion which is connected to the first detection electrode pattern 3 or the second detection electrode pattern 4. Specifically, the first connection wiring 3c of the first detection electrode pattern 3 is located over regions of the input region E1 and the non-input region E2. The first connection wiring 3c corresponding to the non-input region E2 is located on the first light shielding layer 6. According to the embodiment, the first connection wiring 3c corresponding to the non-input region E2 is located on the first insulating layer 7. The connection portion 8a is connected to the first connection wiring 3c on the first insulating layer 7. In addition, the connection portion 8a is located at a region which overlaps with the first light shielding layer 6 and the second light shielding layer 11 in plan view. In addition, the same is applied to the second detection electrode pattern 4.

Figure 5:
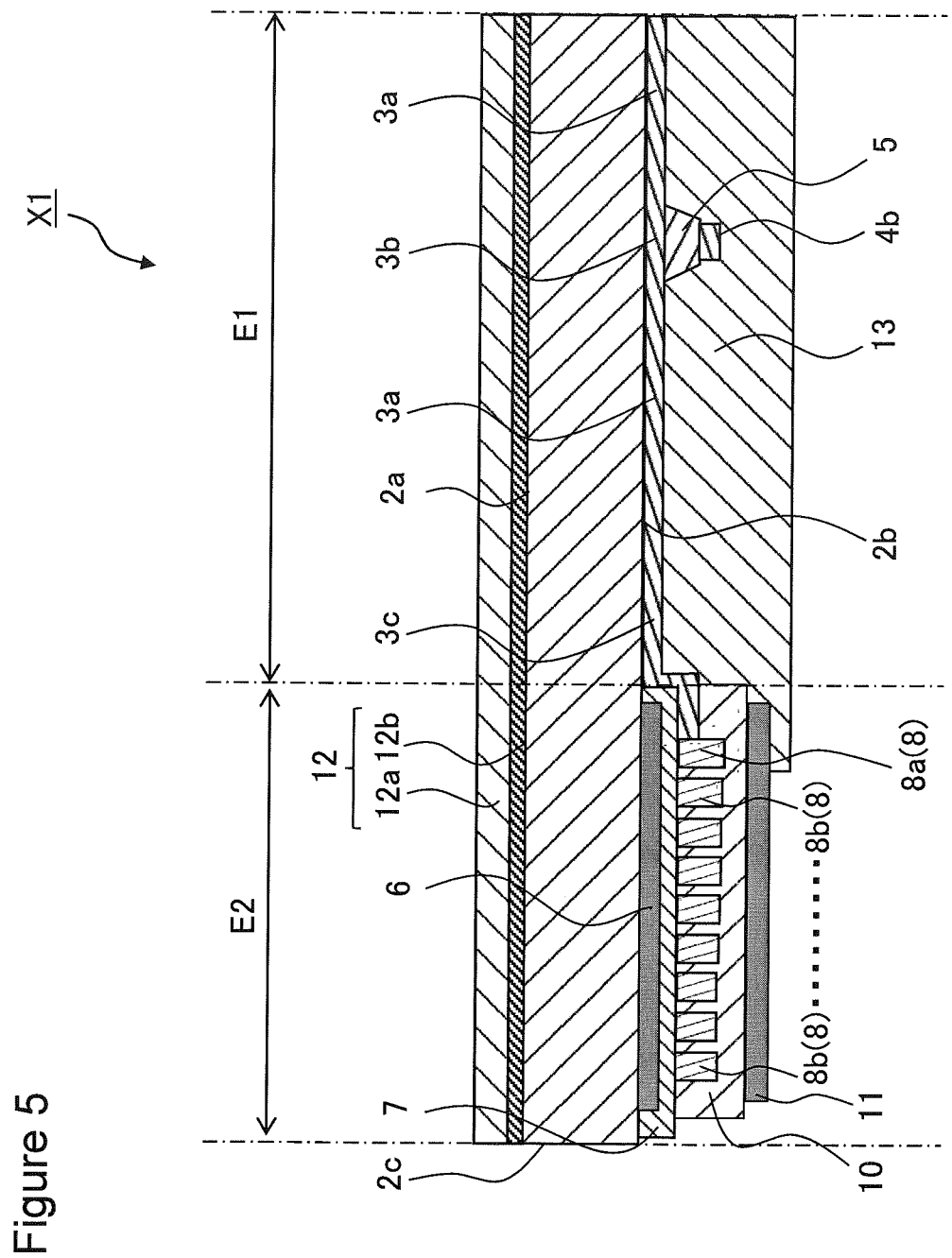
FIG. 5 is a cross-sectional view taken along line III-III illustrated in FIG. 2.

In addition, the connection portion 8a is in contact with the first detection electrode pattern 3 or the second detection electrode pattern 4 as illustrated in FIG. 5, for example, and can be a portion with a certain width in a section view. Here, the certain width in the section view can be approximately 1 mm, for example.

The base portion 8b is a portion which connects the connection portion 8a and the lead-out portion 8c. The base portion 8b is located between the connection portion 8a and the lead-out portion 8c.

The lead-out portion 8c is a portion which is connected to a conductive member (not shown), in order to electrically connect the detection wiring 8 to a position detection driver (not shown). The lead-out portion 8c is located at an external conductive region G1 on the second main face 2b of the base 2. In addition, according to the embodiment, the external conductive region G1 is located between a short side of the base 2 (short side on lower side in FIG. 2) and the input region E1 in plan view, however, not limited thereto, and it is possible to appropriately change an arranging position of the external conductive region G1.

The detection wiring 8 is formed of a thin metal film so as to be hard, and to obtain high stability in shape. As a constituent material of the thin metal film, an aluminum film, an aluminum alloy film, a lamination film of a chromium film and aluminum film, a lamination film of the chromium film and the aluminum alloy film, a silver film, a silver alloy film, or a gold alloy film is used, for example. As a method of forming the thin metal film, for example, there is a sputtering method, a CVD method, or an evaporation method in the related art which is known.

The second insulating layer 10 protects the detection wiring 8 from corrosion due to absorption of moisture in the atmosphere. In addition, the second insulating layer 10 reduces a possibility that the detection wiring 8 and the second light shielding layer 11 are electrically connected. The second insulating layer 10 is provided on the second main face 2b of the base 2 corresponding to the non-input region E2. According to the embodiment, the second insulating layer 10 is provided on the detection wiring 8, and covers the detection wiring 8. A constituent material and a forming method of the second insulating layer 10 are the same as those of the first insulating layer 7.

The second light shielding layer 11 shields a part, or all of light beams which are input in a direction intersecting the first main face 2a and the second main face 2b of the base 2. The second light shielding layer 11 is provided on the second main face 2b of the base 2 corresponding to the non-input region E2. According to the embodiment, the second light shielding layer 11 is provided on the second insulating layer 10. Accordingly, even if the coloring material included in the second light shielding layer 11 is conductive, it is possible to reduce a possibility that the second light shielding layer 11 and the detection wiring 8 are electrically connected. In addition, the second insulating layer 10 may not be provided, and the second light shielding layer 11 may be directly provided on the detection wiring 8. When the second light shielding layer 11 is directly provided on the detection wiring 8, it is preferable that the second light shielding layer 11 not be conductive. In addition, the first insulating layer 7 and the second insulating layer 10 may not be provided, and the second light shielding layer 11 may be directly provided on the first light shielding layer 6. In addition, the second light shielding layer 11 may be provided on the first main face 2a of the base 2 corresponding to the non-input region E2. As a constituent material and a forming method of the second light shielding layer 11, the same as those in the first light shielding layer 6 are applied. In addition, the second light shielding layer 11 may be formed by being colored differently from the first light shielding layer 6.

In this manner, in the input device X1 according to the embodiment, the first light shielding layer 6 is located on the first main face 2a side of the base 2 as compared to the detection wiring 8. In addition, the input device X1 further includes the second light shielding layer 11 which is provided on the second main face 2b of the base 2. Here, the connection portion 8a of the detection wiring 8 is located in a region (first region) which overlaps with the first light shielding layer 6 and the second light shielding layer 11 in plan view. Accordingly, in the input device X1, it is possible to reduce a possibility that at least the connection portion 8a in the detection wiring 8 is viewed by a user, while making the thickness of the first light shielding layer 6 relatively small.

Specifically, in an input device in the related art, since the base and the first light shielding layer are formed of different constituent materials, coefficients of thermal expansion become different from each other. Accordingly, there is a difference between the coefficients of thermal expansion of the base and the first light shielding layer. For this reason, for example, when the input device is incorporated in the display device, there is a possibility that the first light shielding layer may be expanded or contracted due to heat which is transferred to the input device from the backlight of the display device. When the first light shielding layer expands and contracts, an internal stress occurs in the first light shielding layer. That is, since the first light shielding layer is provided on the base of which the coefficient of thermal expansion is different, it is not possible for the first light shielding layer to expand and contract without restriction when heat is applied from the backlight. Hence, the internal stress for maintaining the first light shielding layer on the base occurs in the first light shielding layer. Accordingly, there has been a possibility that a crack may occur in the first light shielding layer, or the first light shielding layer may be separated from the base.

Specifically, the internal stress which occurs in the first light shielding layer becomes large when a distance from the base is large. That is, the internal stress which occurs in the first light shielding layer becomes large when the thickness of the first light shielding layer is large. Accordingly, it was difficult to make the thickness of the first light shielding layer relatively large. In addition, like in the embodiment, if there is a big difference in level between the second main face of the base and the first light shielding layer when the first connection wiring and the second connection wiring are provided over the second main face of the base corresponding to the input region and the first light shielding layer corresponding to the non-input region, there is a high possibility that a crack or a short circuit may occur in the first connection wiring and the second connection wiring. When considering such a point of view, it is difficult to make the thickness of the first light shielding layer relatively large.

However, if the thickness of the first light shielding layer is relatively small, for example, when intensity of light input from the backlight is relatively large in a case in which the input device is incorporated in the display device, there has been a possibility that it may not be possible to sufficiently shield the light in the first light shielding layer, and the detection wiring may be viewed by a user. Specifically, the connection portion is a portion connected to the first connection wiring and the second connection wiring. Thus, the connection portion is located on a side which is close to the input region compared to the base portion and the lead-out portion. Here, the input region is a region in which an input operation is performed by a user, and also is a region in which an image displayed on the display panel is viewed when the input device is incorporated in the display device. Accordingly, there is a high possibility that the intensity of light which is input from the backlight may become relatively large in the input region. That is, there has been a high possibility that the connection portion may be viewed by a user.

Therefore, according to the embodiment, the first light shielding layer 6 is located on the first main face 2a side of the base 2 as compared to the detection wiring 8. In addition, the second light shielding layer 11 is further included on the second main face 2b of the base 2. Here, the connection portion 8a of the detection wiring 8 is located in a region (first region) which overlaps with the first light shielding layer 6 and the second light shielding layer 11 in plan view. Accordingly, it is possible to shield light input to the connection portion 8a of the detection wiring 8 using the first light shielding layer 6 and the second light shielding layer 11. In this manner, in the input device X1, it is possible to reduce the possibility that the connection portion 8a may be viewed by a user, while making the thickness of the first light shielding layer 6 relatively small.

In addition, similarly to the embodiment, it is preferable that the base portion 8b also be located in the region (first region) in which the first light shielding layer 6 and the second light shielding layer 11 overlap with each other in plan view, in addition to the connection portion 8a. When the base portion 8b is located in the region (first region) in which the first light shielding layer 6 and the second light shielding layer 11 overlap with each other in plan view, it is possible to shield light input to the base portion 8b, using the first light shielding layer 6 and the second light shielding layer 11. Thus, it is possible to reduce a possibility that the base portion 8b may be viewed by a user. In addition, as described above, the lead-out portion 8c is a portion which is connected to a flexible printed wiring board, or the like. Thus, the second light shielding layer 11 is not located on the lead-out portion 8c.

In addition, similarly to the embodiment, it is preferable that the second light shielding layer 11 have approximately the same shape as that of the first light shielding layer 6 in plan view. When the second light shielding layer 11 has approximately the same shape as that of the first light shielding layer 6 in plan view, it is possible to similarly shield the region in which the first light shielding layer 6 is located, and the region in which the second light shielding layer 11 is located. As a result, a design in the non-input region E2 is improved.

In addition, the second light shielding layer 11 may be located outside as compared to the region in which the first light shielding layer 6 is located in plan view. In this case, the first main face 2a of the base 2 corresponding to the non-input region E2 has the region in which the first light shielding layer 6 and the second light shielding layer 11 overlap with each other (first region), and the region in which the second light shielding layer 11 is located, in plan view. Accordingly, it is possible to color, by applying a difference in shading, into two regions of which transmissivity is different in the first main face 2a of the base 2 corresponding to the non-input region E2. Thus, the design of the input device X1 in the non-input region E2 is improved.

In addition, the second light shielding layer 11 may be located inside as compared to the region in which the first light shielding layer 6 is located in plan view. In this case, the first main face 2a of the base 2 corresponding to the non-input region E2 has the region in which the first light shielding layer 6 and the second light shielding layer 11 overlap with each other (first region), and the region in which the first light shielding layer 6 is located, in plan view. Accordingly, it is possible to color, by applying a difference in shading, into two regions of which transmissivity is different in the first main face 2a of the base 2 corresponding to the non-input region E2. Thus, the design of the input device X1 in the non-input region E2 is improved.

In addition, the thickness of the second insulating layer 10 may be equal to or larger than 0.1 μm, insulation resistance of the second insulating layer 10 may be equal to or larger than 0.1 MΩ, and a coloring material of the second light shielding layer 11 may be a material other than carbon. According to the above described conditions, it is possible to reduce a possibility that electrical interference may occur between the second light shielding layer 11 and the detection wiring 8. Accordingly, it is possible to reduce a possibility that a detection sensitivity of the input device X1 may deteriorate. In addition, as a matter of course, the input device according to the present invention is not limited to the above described conditions.

In addition, according to the embodiment, the first light shielding layer 6 and the second light shielding layer 11 are provided on the second main face 2b of the base 2, however, not limited thereto, and the first light shielding layer and the second light shielding layer may be provided on the first main face 2a of the base 2. Like the embodiment, when the first light shielding layer 6 and the second light shielding layer 11 are provided on the second main face 2b of the base 2, it is possible to increase flatness on the first main face 2a of the base 2, and to improve the design.

The first protection member 12 protects the first main face 2a of the base 2 from being damaged due to contact with the finger F1 of a user. The first protection member 12 is provided over the entire first main face 2a of the base 2. In addition, the first protection member 12 may not be provided entirely over the first main face 2a of the base 2, and may be provided only on the first main face 2a of the base 2 corresponding to the input region E1. The first protection member 12 includes a protection sheet 12a and an adhesive 12b. The protection sheet 12a is provided on the first main face 2a of the base 2 through the adhesive 12b. As a constituent material of the protection sheet 12a, glass or plastic is used, for example. In addition, as a constituent material of the adhesive 12b, an acrylic adhesive, a silicone adhesive, a rubber adhesive, or a urethane adhesive is used, for example.

The second protection member 13 protects the first detection electrode pattern 3, the second detection electrode pattern 4, and the connection wiring 9 from corrosion due to absorption of moisture in the atmosphere. The second protection member 13 is provided on the second main face 2b of the base 2 corresponding to the input region E1 and a partial region of the non-input region E2, and covers the first detection electrode pattern 3, the second detection electrode pattern 4, and the insulator 5. In addition, according to the embodiment, the second protection member 13 covers a part of the second light shielding layer 11, however, not limited thereto, and the second protection member may cover the entire second light shielding layer 11. When the second protection member 13 covers the entire second light shielding layer 11, it is possible to reduce a possibility that the second light shielding layer 11 may be corroded due to absorption of moisture in the atmosphere. As a constituent material of the second protection member 13, the same material as that of the adhesive 12b, silicon nitride or silicon dioxide, or the like, is used.

Subsequently, a detection principle of the input device X1 will be described.

The position detection driver, which is not illustrated, is electrically connected to the lead-out portion 8c of the detection wiring 8 which is located in the external conductive region G1. In addition, a power supply device, which is not illustrated, supplies voltages to the first detection electrode pattern 3 and the second detection electrode pattern 4. Here, when the finger F1 which is a conductor approaches, contacts, or presses the first main face 2a of the base 2 corresponding to the input region E1 through the first protection member 12, electrostatic capacitance is generated between the finger F1 and the first detection electrode 3a, and between the finger F1 and the second detection electrode 4a. The position detection driver constantly detects the electrostatic capacitance which is generated in the first detection electrode pattern 3 and the second detection electrode pattern 4, and detects an input position of an input operation by a user, by combining the first detection electrode pattern 3 and the second detection electrode pattern 4 in which electrostatic capacitance of a predetermined value or more is detected. In this manner, the input device X1 can detect an input position.

As described above, in the input device X1, it is possible to reduce the possibility that at least the connection portion 8a of the detection wiring 8 may be viewed by a user, while making the thickness of the first light shielding layer 6 relatively small.

Subsequently, a display device Y1 including the input device X1 will be described with reference to FIG. 6.

Figure 6:
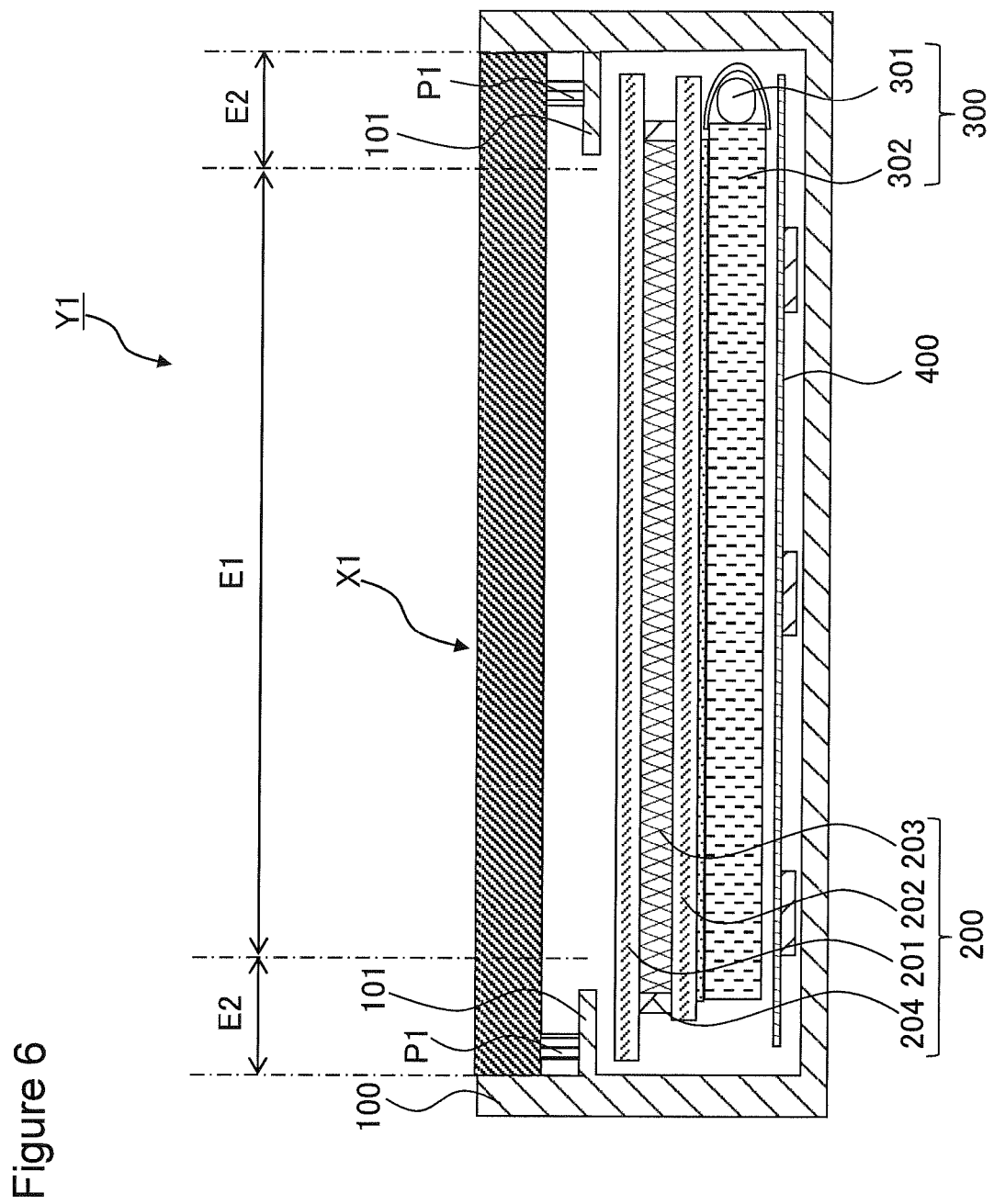
FIG. 6 is a cross-sectional view illustrating a schematic configuration of a display device according to the embodiment.

As illustrated in FIG. 6, the display device Y1 according to the embodiment includes the input device X1, a first housing 100, a display panel 200, a backlight 300, and a circuit board 400.

The input device X1 is supported by the first housing 100. Specifically, the input device X1 is provided on a supporting member P1 on a support unit 101 of the first housing 100. In addition, the supporting member P1 may not be provided, and the input device X1 may be directly provided on the support unit 101 of the first housing 100. As a constituent material of the first housing 100, a resin such as polycarbonate, or metal such as stainless, or aluminum is used, for example.

The display panel 200 displays an image. The display panel 200 includes an upper substrate 201, a lower substrate 202, a liquid crystal layer 203, and a sealing member 204.

The upper substrate 201 is arranged so as to face the second main face 2b of the base 2 of the input device X1. In addition, the input device X1 may be provided on the upper substrate 201 through a fixing member. As the fixing member, a double-sided tape, a thermosetting resin, an ultraviolet ray curable resin, or a fastener such as a screw, is used, for example. In particular, it is preferable to use an optical adhesive material as the fixing member in order to improve viewability. The lower substrate 202 is arranged so as to face the upper substrate 201. As constituent materials of the upper substrate 201 and the lower substrate 202, a transparent resin material such as glass or plastic is used, for example.

The liquid crystal layer 203 is a display member layer for displaying an image, and is interposed between the upper substrate 201 and the lower substrate 202. Specifically, the liquid crystal layer 203 is sealed in a region between the upper substrate 201 and the lower substrate 202 using the upper substrate 201, the lower substrate 202, and the sealing member 204. In addition, the display panel 200 according to the embodiment includes the liquid crystal layer 203 as the display member layer, however, not limited thereto. A plasma generating layer or an organic EL layer may be provided instead of the liquid crystal layer 203.

The backlight 300 inputs light to the entire lower face of the display panel 200. The backlight 300 is arranged on the rear side of the display panel 200. The backlight 300 includes a light source 301 and a light guiding plate 302. The light source 301 is a member which outputs light toward the light guiding plate 302, and is configured of a light emitting diode (LED). In addition, the light source 301 may not be configured of the LED, and may be configured of a cold cathode fluorescent lamp, a halogen lamp, a xenon lamp, or an electro-luminescence (EL). The light guiding plate 302 is a member which approximately uniformly guides light from the light source 301 over the entire lower face of the display panel 200. In addition, when a display panel in which a spontaneous light emitting element instead of the display panel 200 is used, the backlight 300 may not be provided.

The circuit board 400 supports an electronic component such as a control circuit which controls the display panel 200 and the backlight 300, a resistor, or a capacitor. The circuit board 400 is arranged on the rear side of the backlight 300. The control circuit which is located on the circuit board 400 is electrically connected to the display panel 200 and the backlight 300 using a flexible printed wiring board (not shown), or the like. In addition, the circuit board 400 may include the position detection driver of the input device X1. In addition, a plurality of the circuit boards 400 may be provided. As a constituent material of the circuit board 400, a resin material is used, for example.

In this manner, the display device Y1 can input various types of information by performing an input operation with respect to the input region E1 of the input device X1, while seeing the display panel 200 through the input device X1. In addition, the input device X1 may be provided with a function of presenting various senses of touch such as a sensation of pressing, a sensation of tracing, a sensation of touch, or the like, when inputting various types of information, to a user who inputs information. In this case, one or a plurality of vibrators (for example, piezoelectric elements, or the like) are provided on the base 2 in the input device X1, and when a predetermined input operation, or a predetermined pressing load is detected, it is possible to execute the function by vibrating the vibrator using a predetermined frequency.

As described above, since the display device Y1 includes the input device X1, it is possible to reduce the possibility that at least the connection portion 8a of the detection wiring 8 may be viewed by a user while making the thickness of the first light shielding layer 6 relatively small.

Subsequently, a mobile terminal Z1 including the display device Y1 will be described with reference to FIG. 7.

Figure 7:
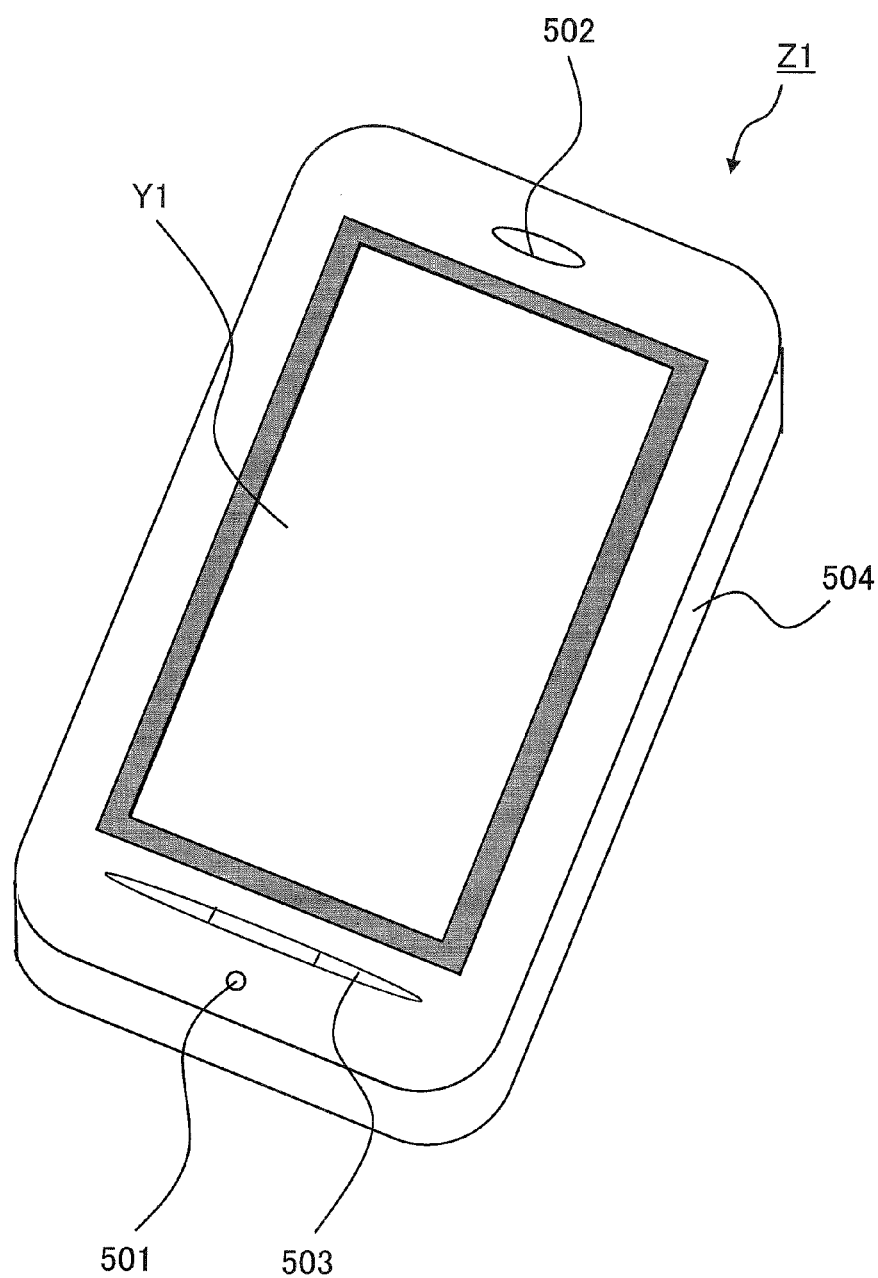
FIG. 7 is a perspective view illustrating a schematic configuration of a mobile terminal according to the embodiment.

As illustrated in FIG. 7, the mobile terminal Z1 according to the embodiment is a smart phone terminal as an electronic apparatus. In addition, the mobile terminal Z1 may be an electronic apparatus such as a mobile phone, a tablet terminal, or a Personal Digital Assistant (PDA), for example, without being limited to the smart phone terminal. The mobile terminal Z1 includes a display device Y1, a sound input unit 501, a sound output unit 502, a key input unit 503, and a second housing 504.

The sound input unit 501 inputs a voice of a user, or the like, and is configured of a microphone, or the like. The sound output unit 502 outputs a sound, or the like, from the other, and is configured of a magnetic speaker, a piezoelectric speaker, or the like. The key input unit 503 is configured of a mechanical key. In addition, the key input unit 503 may be an operation key which is displayed on a display screen. The second housing 504 accommodates the display device Y1, the sound input unit 501, the sound output unit 502, and the key input unit 503. In addition, the second housing 504 may not be provided, and the sound input unit 501, the sound output unit 502, and the key input unit 503 may be accommodated in the first housing 100 of the display device Y1. As a constituent material of the second housing 504, the same material as that of the first housing 100 of the display device Y1 is used.

In addition to this, there is a case in which the mobile terminal Z1 includes a digital camera functional unit, a one-segment broadcasting tuner, a short distance radio communication unit such as an infrared communication functional unit, a wireless LAN module, a Bluetooth module, and various interfaces, or the like, according to necessary functions, however, detailed illustrations and descriptions of these will be omitted.

As described above, since the mobile terminal Z1 includes the display device Y1, it is possible to reduce the possibility that at least the connection portion 8a of the detection wiring 8 may be viewed by a user while making the thickness of the first light shielding layer 6 relatively small.

Here, the display device Y1 may be provided in various electronic apparatuses such as an electronic organizer, a personal computer, a copy machine, a terminal device for games, a television, a digital camera, or a programmable displayer which is used for industrial use, instead of the above described mobile terminal Z1.

In addition, the above described embodiment is a specific example of the embodiment of the present invention, and it is possible to perform various modifications. Hereinafter, a few of main modification examples will be described.

Modification Example 1

Figure 8:
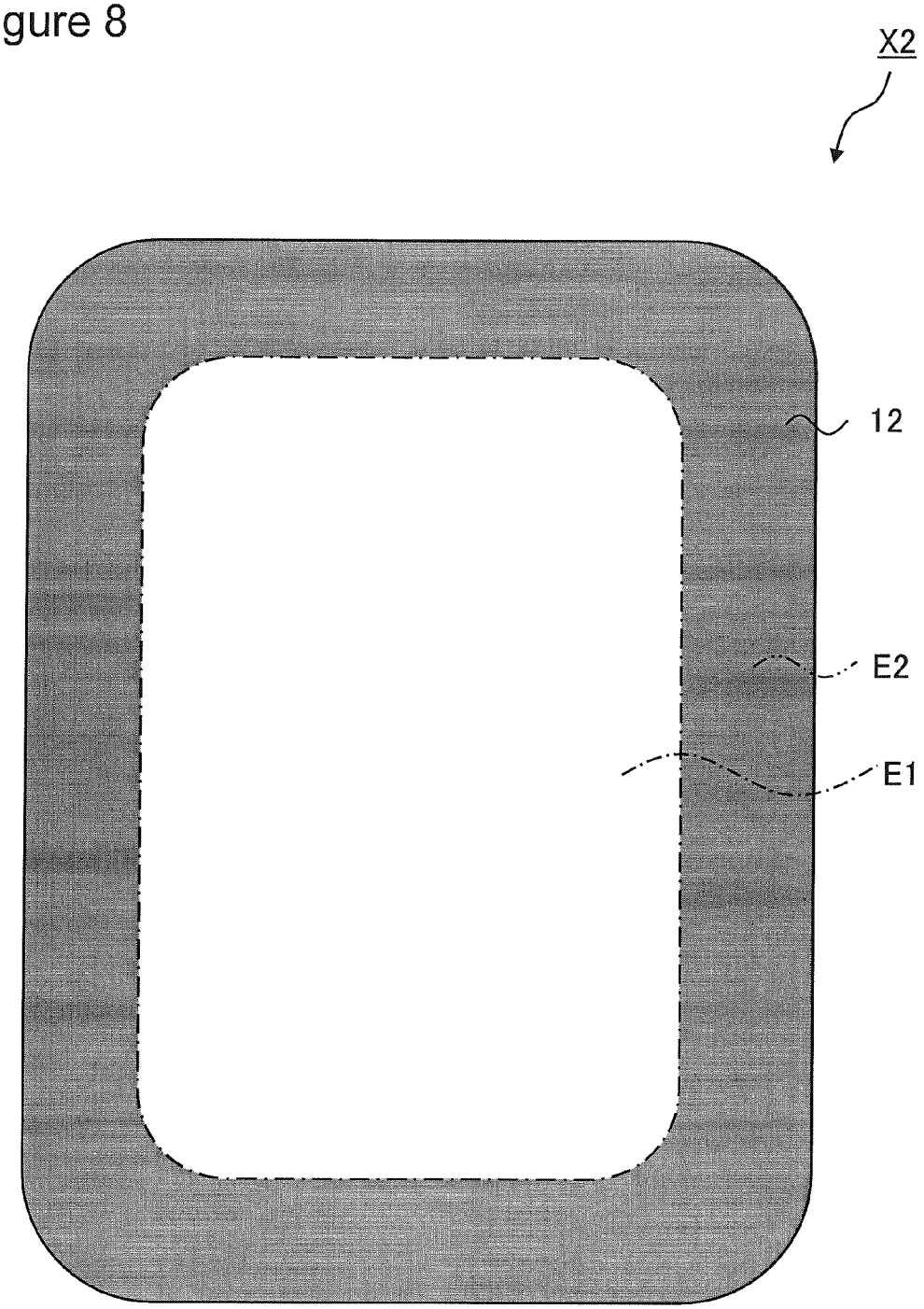
FIG. 8 is a plan view illustrating a schematic configuration of an input device according to modification example 1.
Figure 9:
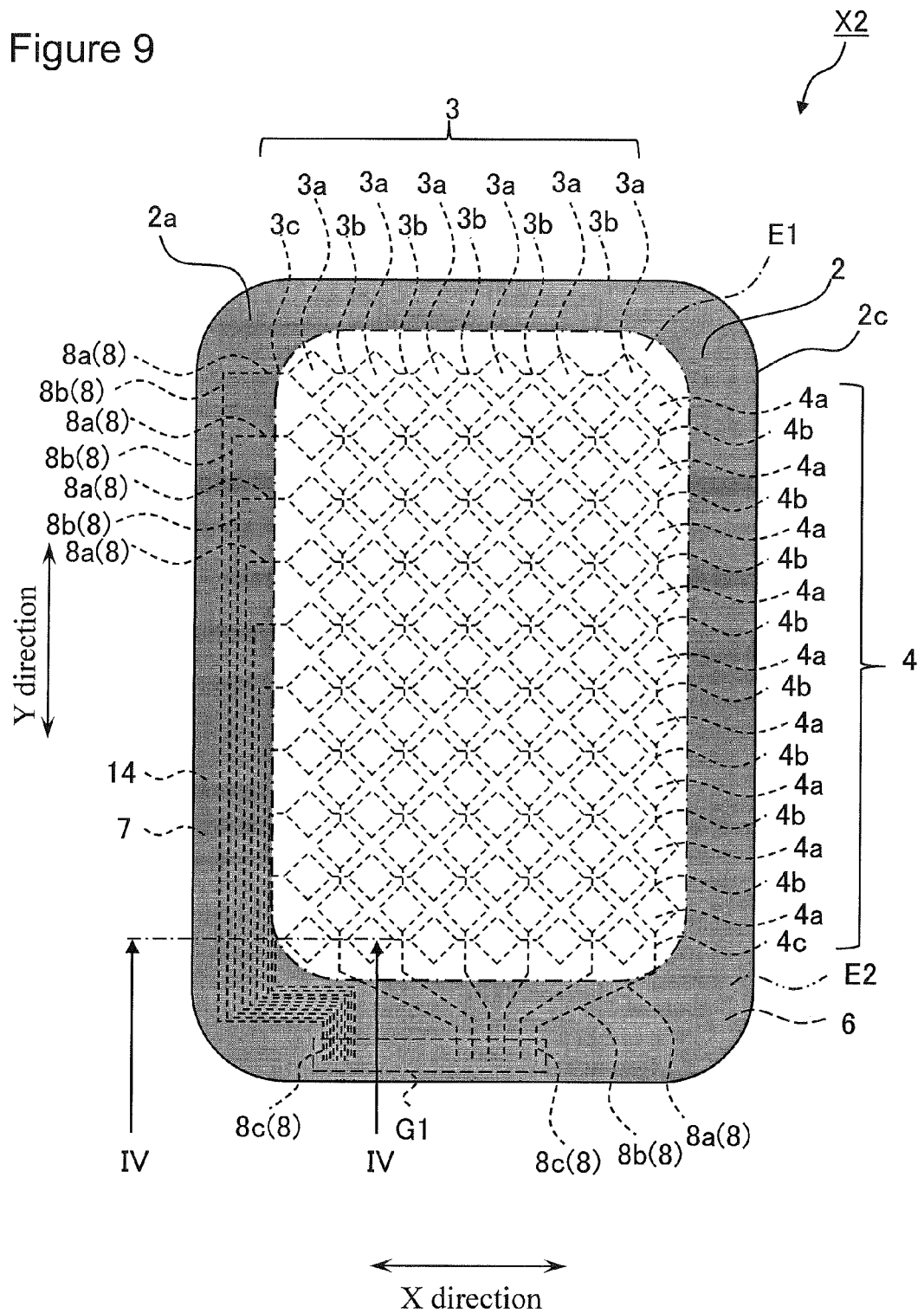
FIG. 9 is a plan view illustrating a schematic configuration of the input device according to the modification example 1, and is a view seen through a base.
Figure 10:
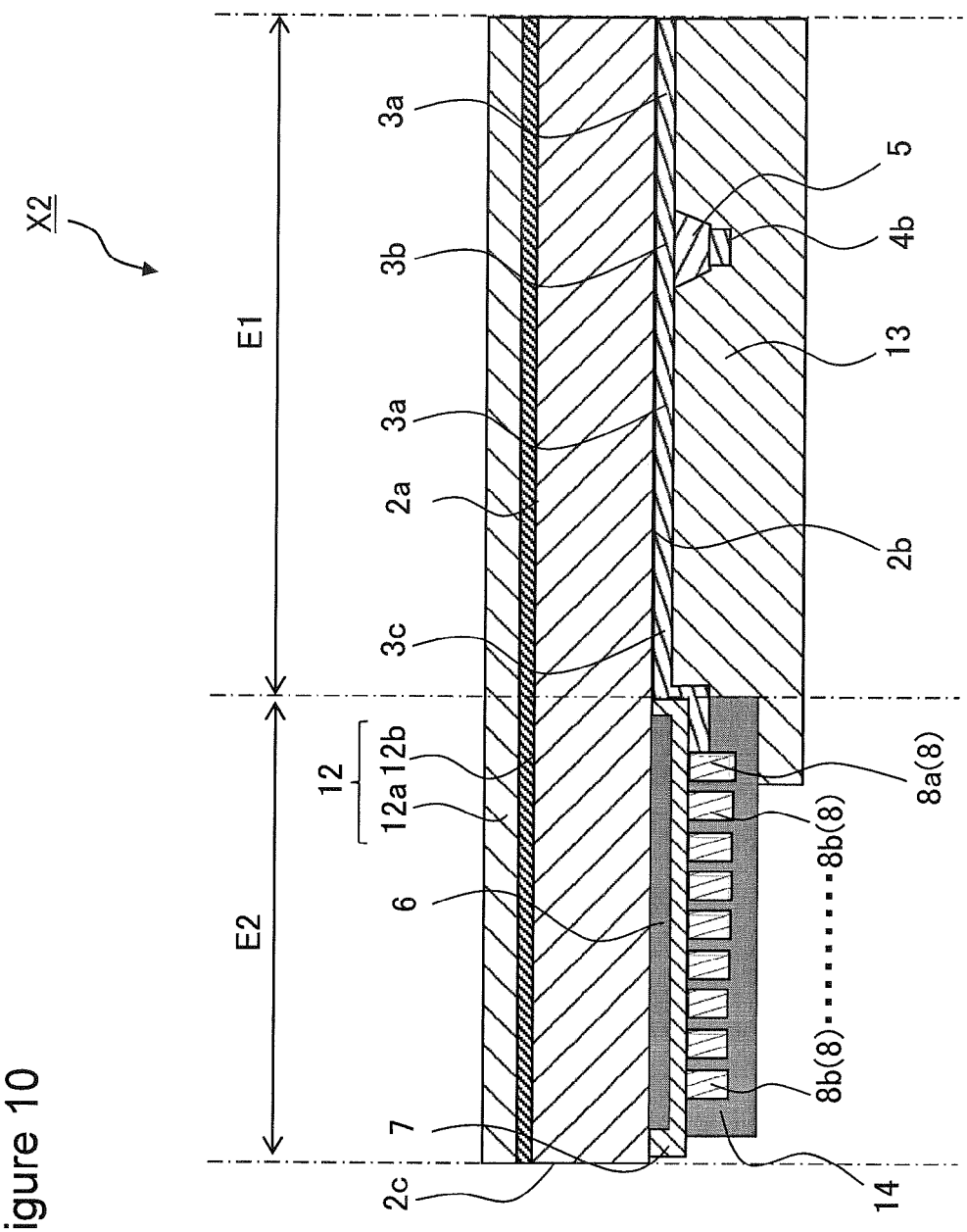
FIG. 10 is a cross-sectional view taken along line IV-IV illustrated in FIG. 9.

FIG. 8 is a plan view illustrating a schematic configuration of an input device X2 according to modification example 1. FIG. 9 is a plan view illustrating a schematic configuration of the input device X2 according to the modification example 1, and is a view seen through the base 2. FIG. 10 is a cross-sectional view which is taken along line IV-IV illustrated in FIG. 9. In addition, in FIGS. 8 to 10, configurations having the same function as that in FIGS. 1, 2, and 5 will be given the same reference numerals, and detailed descriptions thereof will be omitted. In addition, in FIG. 9, for ease of description, illustrations of the insulator 5, the first protection member 12, and the second protection member 13 will be omitted.

As illustrated in FIGS. 8 to 10. The input device X2 includes a second light shielding layer 14 instead of the second light shielding layer 11 which is included in the input device X1. The second light shielding layer 14 is provided on the second main face 2b of the base 2 corresponding to the non-input region E2. In addition, the second light shielding layer 14 covers the detection wiring 8. Specifically, the second light shielding layer 14 covers the connection portion 8a of the detection wiring 8. Here, the connection portion 8a is located on the side which is close to the input region E1 compared to the base portion 8b and the lead-out portion 8c. Since the second light shielding layer 14 covers the connection portion 8a in the input device X2, it is possible to shield light input to the first main face 2a of the base 2 corresponding to the input region E1 by intersecting in the oblique direction. Accordingly, in the input device X2, it is possible to reduce a possibility that the connection portion 8a of the detection wiring 8 may be viewed by a user as compared to the input device X1.

In addition, it is preferable that the second light shielding layer 14 be insulative in order to electrically insulate the detection wirings 8. As a constituent material of the second light shielding layer 14, a material in which titanium is included in a resin material is used, for example.

Modification Example 2

Figure 11:
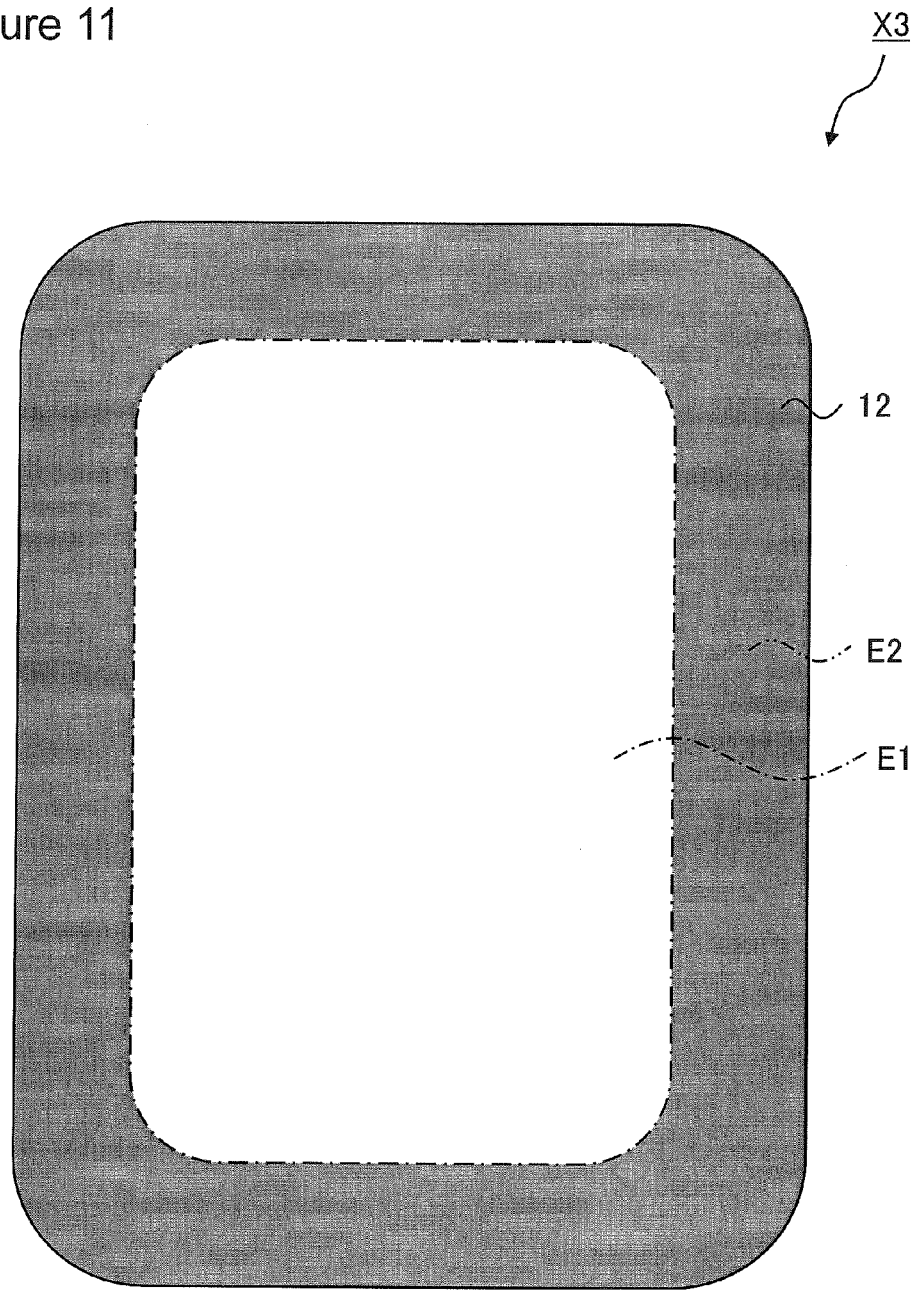
FIG. 11 is a plan view illustrating a schematic configuration of an input device according to modification example 2.
Figure 12:
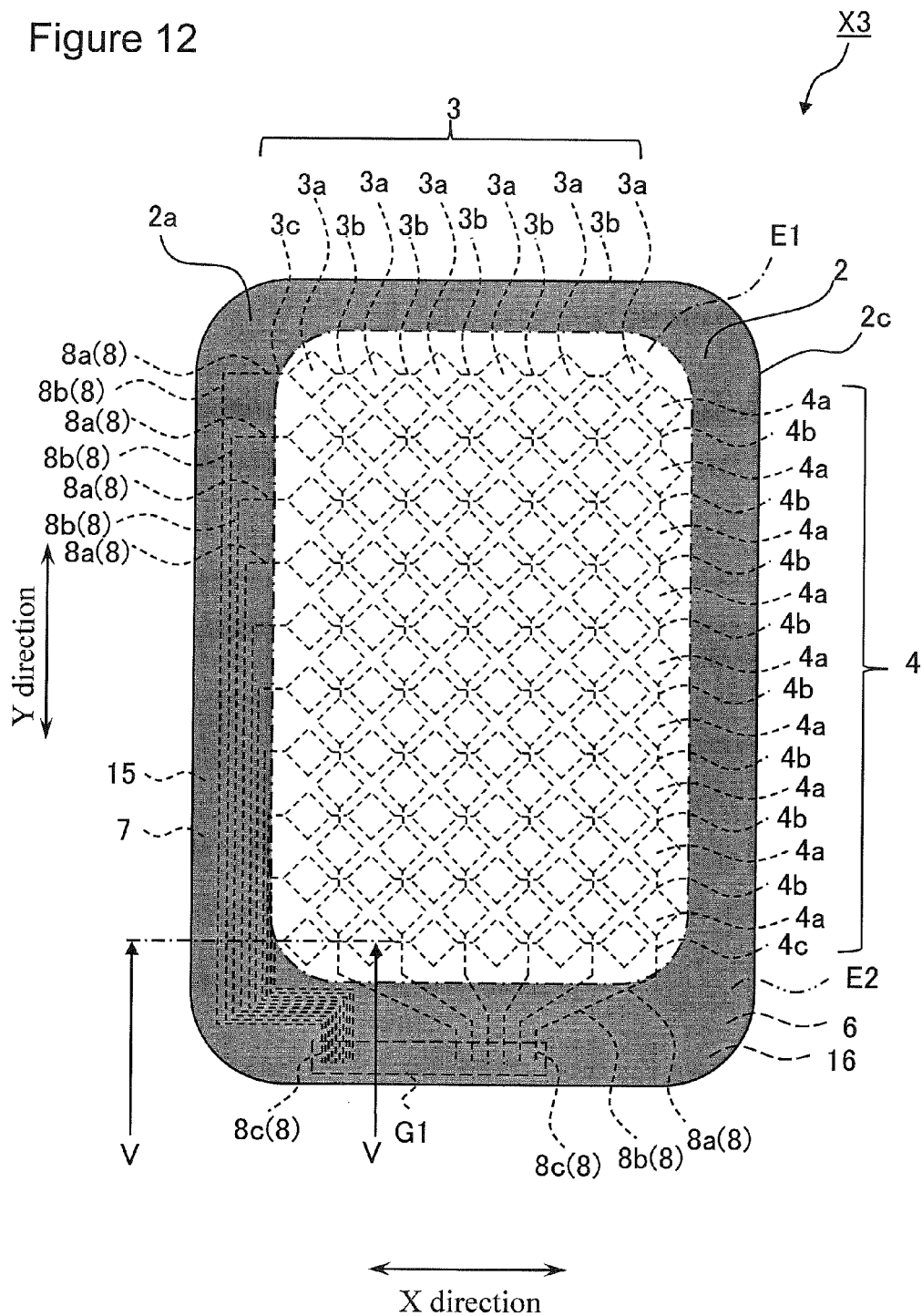
FIG. 12 is a plan view illustrating a schematic configuration of the input device according to the modification example 2, and is a view seen through a base.
Figure 13:
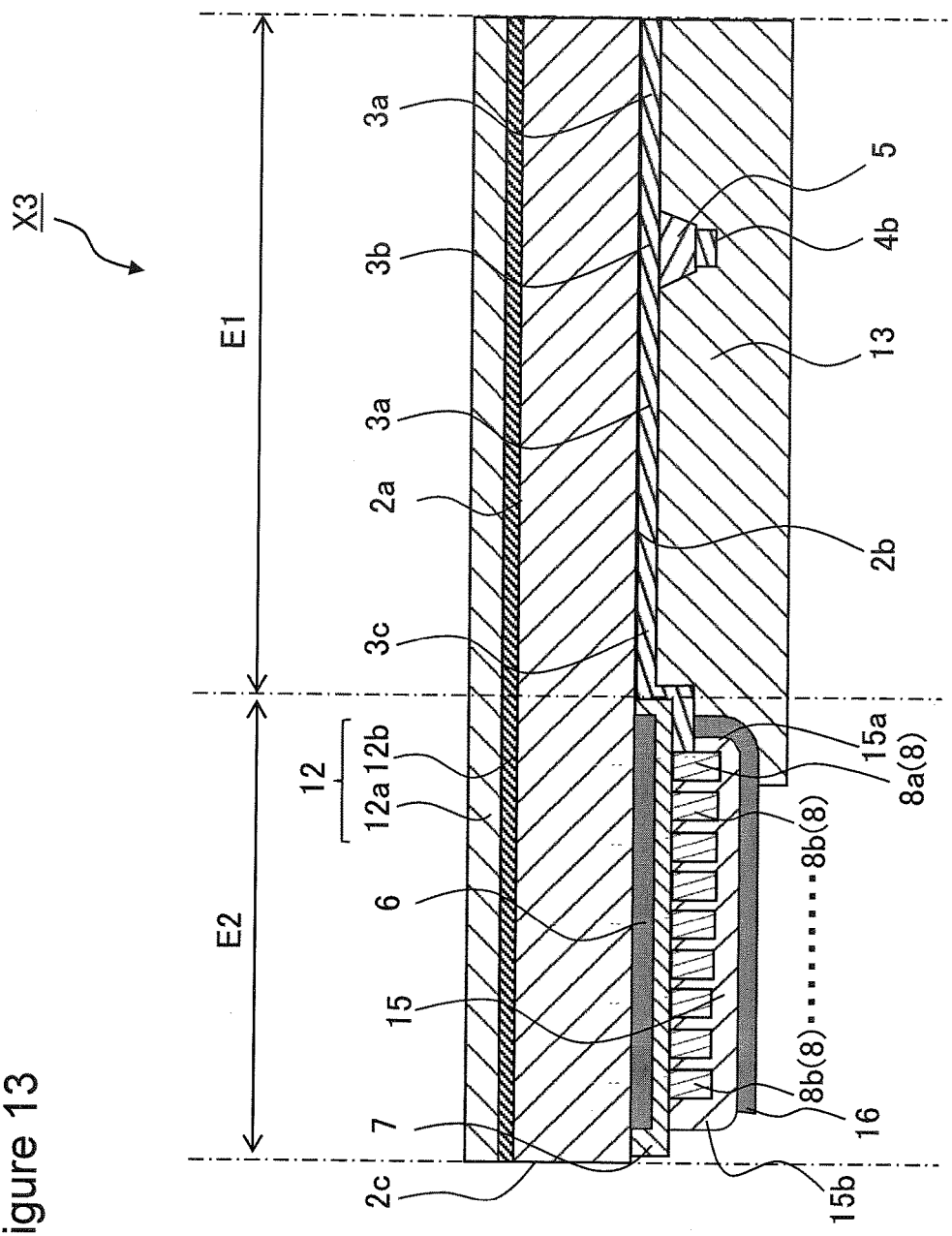
FIG. 13 is a cross-sectional view taken along line V-V illustrated in FIG. 12.

FIG. 11 is a plan view illustrating a schematic configuration of an input device X3 according to modification example 2. FIG. 12 is a plan view illustrating a schematic configuration of the input device X3 according to the modification example 2, and is a view seen through the base 2. FIG. 13 is a cross-sectional view taken along line V-V illustrated in FIG. 12. In addition, in FIGS. 11 to 13, configurations having the same function as that in FIGS. 1, 2, and 5 will be given the same reference numerals, and detailed descriptions thereof will be omitted. In addition, in FIG. 12, for ease of description, illustrations of the insulator 5, the second protection member 13, and a second insulating layer 15 will be omitted.

As illustrated in FIGS. 11 to 13, in the input device X3, the second insulating layer 15 is provided instead of the second insulating layer 10 which is provided in the input device X1. In addition, in the input device X3, a second light shielding layer 16 is provided instead of the second light shielding layer 11 which is provided in the input device X1.

The second insulating layer 15 is located on the second main face 2b of the base 2 corresponding to the non-input region E2. The second insulating layer 15 is provided on the first insulating layer 7, and covers the detection wiring 8. In addition, the second insulating layer 15 includes a first end portion 15a which is located on the input region E1 side, and a second end portion 15b which is located on the end face 2c side of the base 2. The second light shielding layer 16 is provided on the first light shielding layer 6 corresponding to the non-input region E2. Specifically, the second light shielding layer 16 is located on the second insulating layer 15. Here, the second light shielding layer 16 covers the first end portion 15a of the second insulating layer 15. Accordingly, the second light shielding layer 16 can shield light which is input to the first main face 2a of the base 2 corresponding to the input region E1 by intersecting in the oblique direction. Thus, in the input device X3, it is possible to reduce a possibility that the connection portion 8a of the detection wiring 8 may be viewed by a user as compared to the input device X1.

In addition, as in the modification example 2, it is preferable that the front surface of the first end portion 15a be a curved face. When the front surface of the first end portion 15a forms a curved surface, it is possible to reduce a possibility that stress may concentrate on the second light shielding layer 16 which is located on the first end portion 15a. Thus, in the input device X3, it is possible to reduce a possibility that peeling off may occur in the second light shielding layer 16 which covers the first end portion 15a when the first main face 2a of the base 2 is repeatedly pressed through the first protection member 12 using the finger F1 of a user. In addition, the second light shielding layer 16 covers the first end portion 15a of the second insulating layer 15, however, not limited thereto, and the second light shielding layer may cover the entire second insulating layer 15.

Modification Example 3

Figure 14:
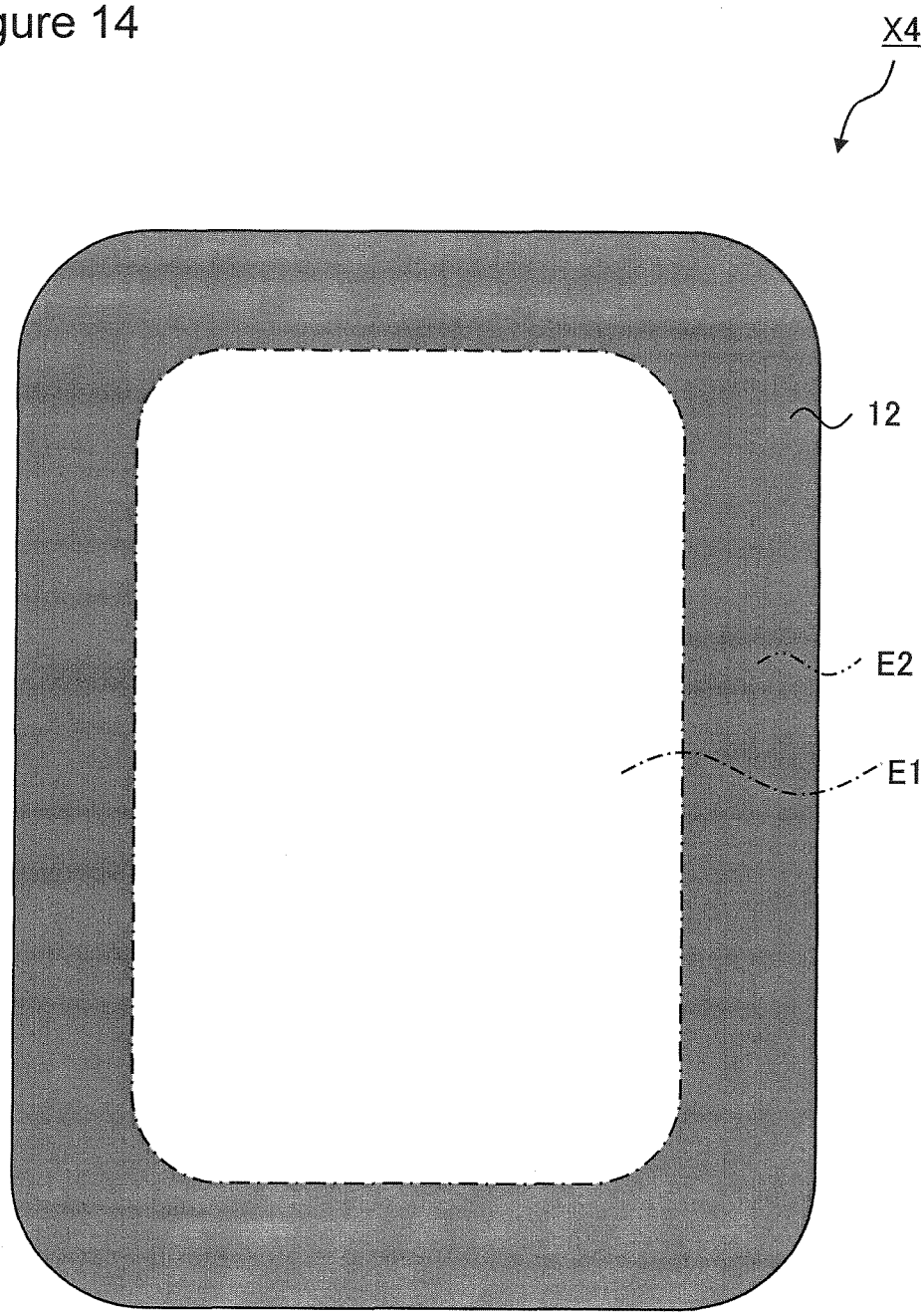
FIG. 14 is a plan view illustrating a schematic configuration of an input device according to modification example 3.
Figure 15:
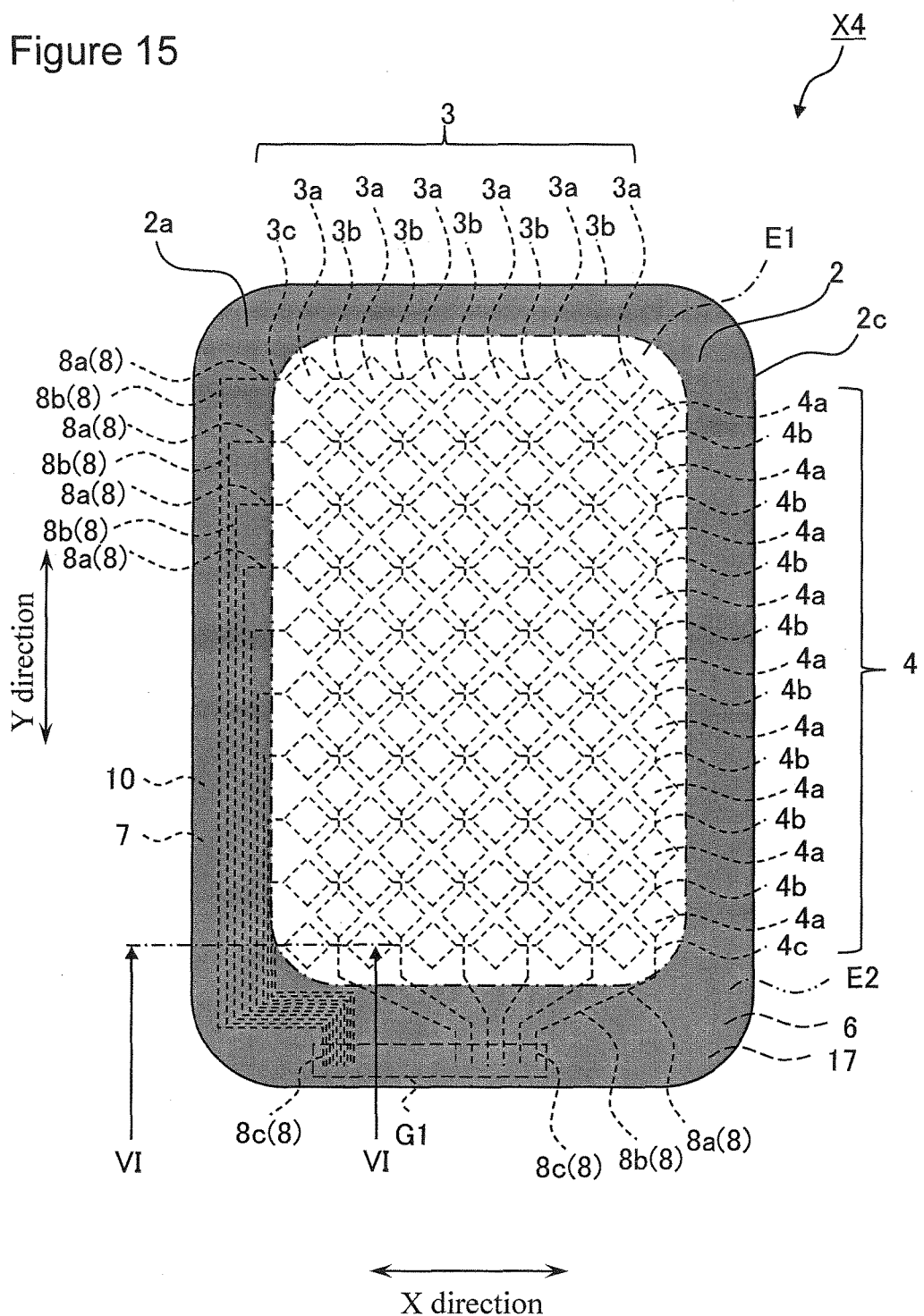
FIG. 15 is a plan view illustrating the schematic configuration of the input device according to the modification example 3, and is a view seen through a base.
Figure 16:
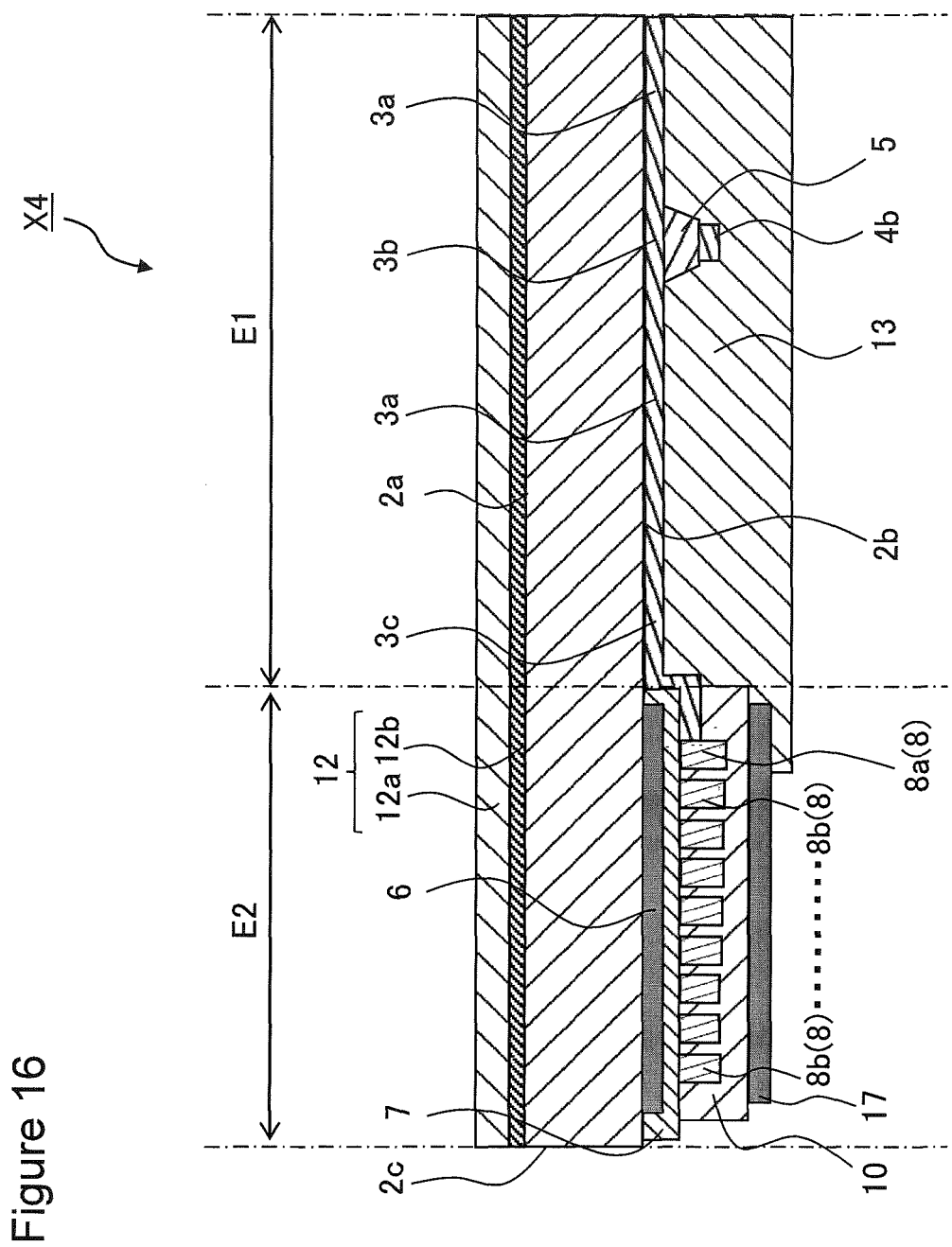
FIG. 16 is a cross-sectional view taken along line VI-VI illustrated in FIG. 15.

FIG. 14 is a plan view illustrating a schematic configuration of an input device X4 according to a modification example 3. FIG. 15 is a plan view illustrating a schematic configuration of the input device X4 according to the modification example 3, and is a view seen through the base 2. FIG. 16 is a cross-sectional view taken along line VI-VI illustrated in FIG. 15. In addition, in FIGS. 14 to 16, configurations having the same function as that in FIGS. 1, 2, and 5 will be given the same reference numerals, and detailed descriptions thereof will be omitted. In addition, in FIG. 15, for ease of description, illustrations of the insulator 5, the first protection member 12, and the second protection member 13 will be omitted.

As illustrated in FIGS. 14 to 16, a second light shielding layer 17 is provided in the input device X4 instead of the second light shielding layer 11 which is provided in the input device X1. The second light shielding layer 17 is provided on the second main face 2b of the base 2 corresponding to the non-input region E2. Specifically, the second light shielding layer 17 is located on the second insulating layer 10. In addition, the second light shielding layer 17 is conductive. Thus, for example, when the input device X4 is incorporated in the display device Y1 instead of the input device X1, it is possible to shield electrical noise which occurs from the display panel, using the second light shielding layer 17. Accordingly, it is possible to reduce a possibility that detection sensitivity may deteriorate due to the input detection wiring 8 which is influenced by the electrical noise.

In addition, it is preferable that the second light shielding layer 17 be set to a reference potential, in particular, to a ground potential. As a method of setting the second light shielding layer 17 to the ground potential, there is a method in which the second light shielding layer 17 is connected to a ground potential of the first housing 100 by causing the support unit 101 of the first housing 100 and the second light shielding layer 17 to be in contact with each other when the input device X4 is incorporated in the display device Y1 instead of the input device X1, for example.

In addition, the second light shielding layer 17 is provided on the second insulating layer 10, however, not limited thereto, and may cover the entire second insulating layer 10. When the second light shielding layer 17 covers the entire second insulating layer 10, it is possible to effectively shield electrical noise.

As a constituent material of the second light shielding layer 17 which is conductive, for example, a resin material in which carbon is included is used.

Modification Example 4

Figure 17:
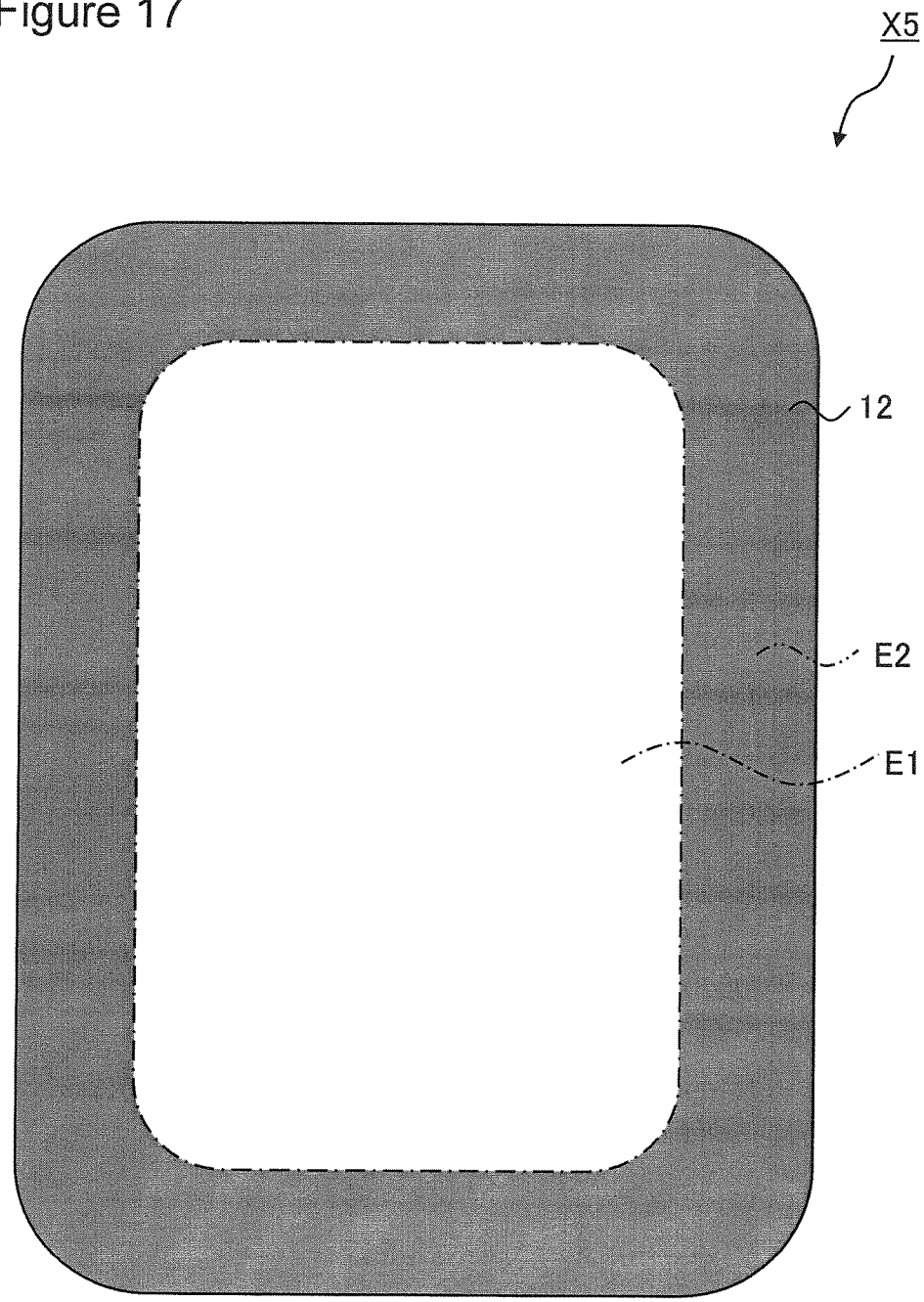
FIG. 17 is a plan view illustrating a schematic configuration of an input device according to modification example 4.
Figure 18:
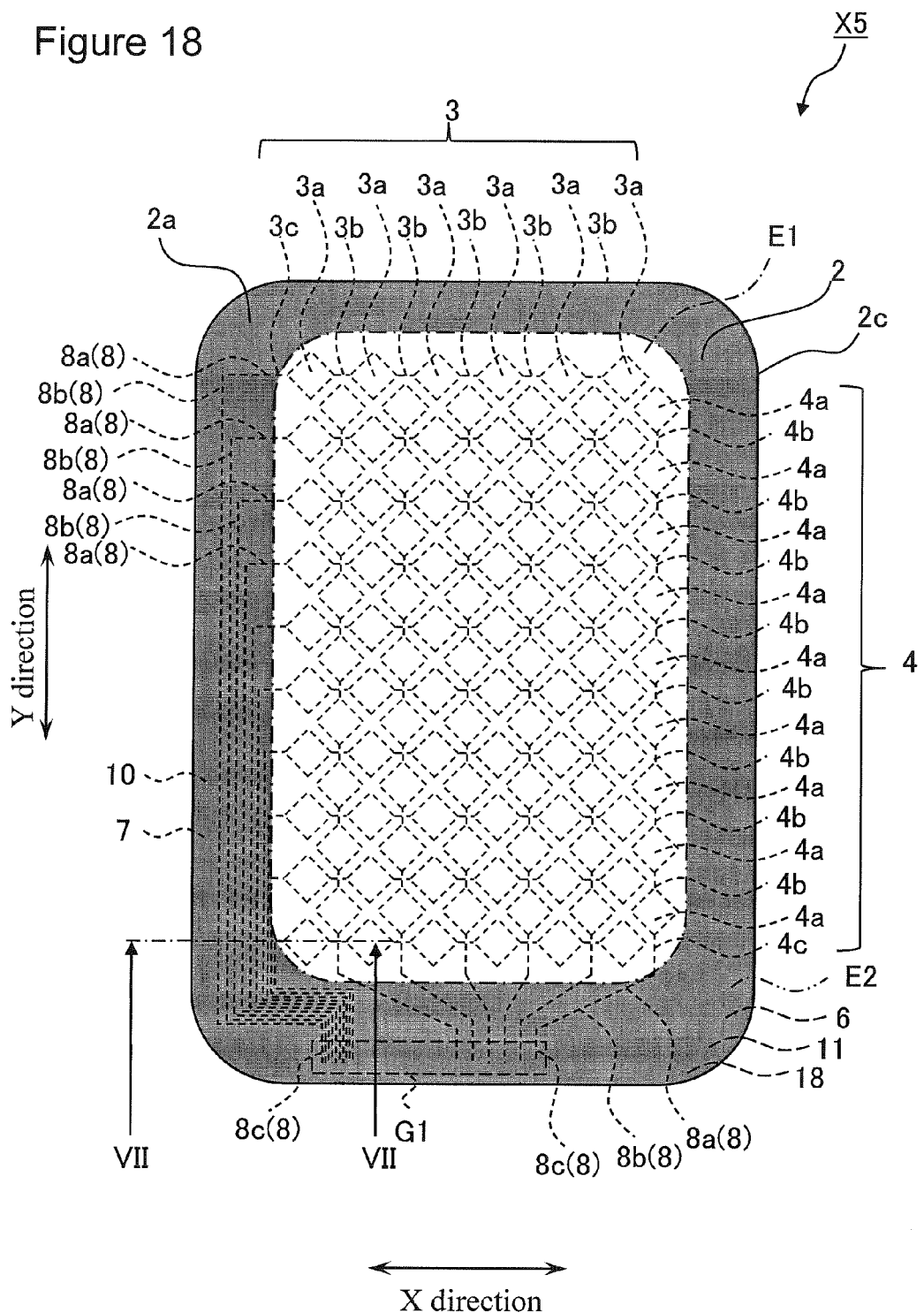
FIG. 18 is a plan view illustrating a schematic configuration of the input device according to the modification example 4, and is a view seen through a base.
Figure 19:
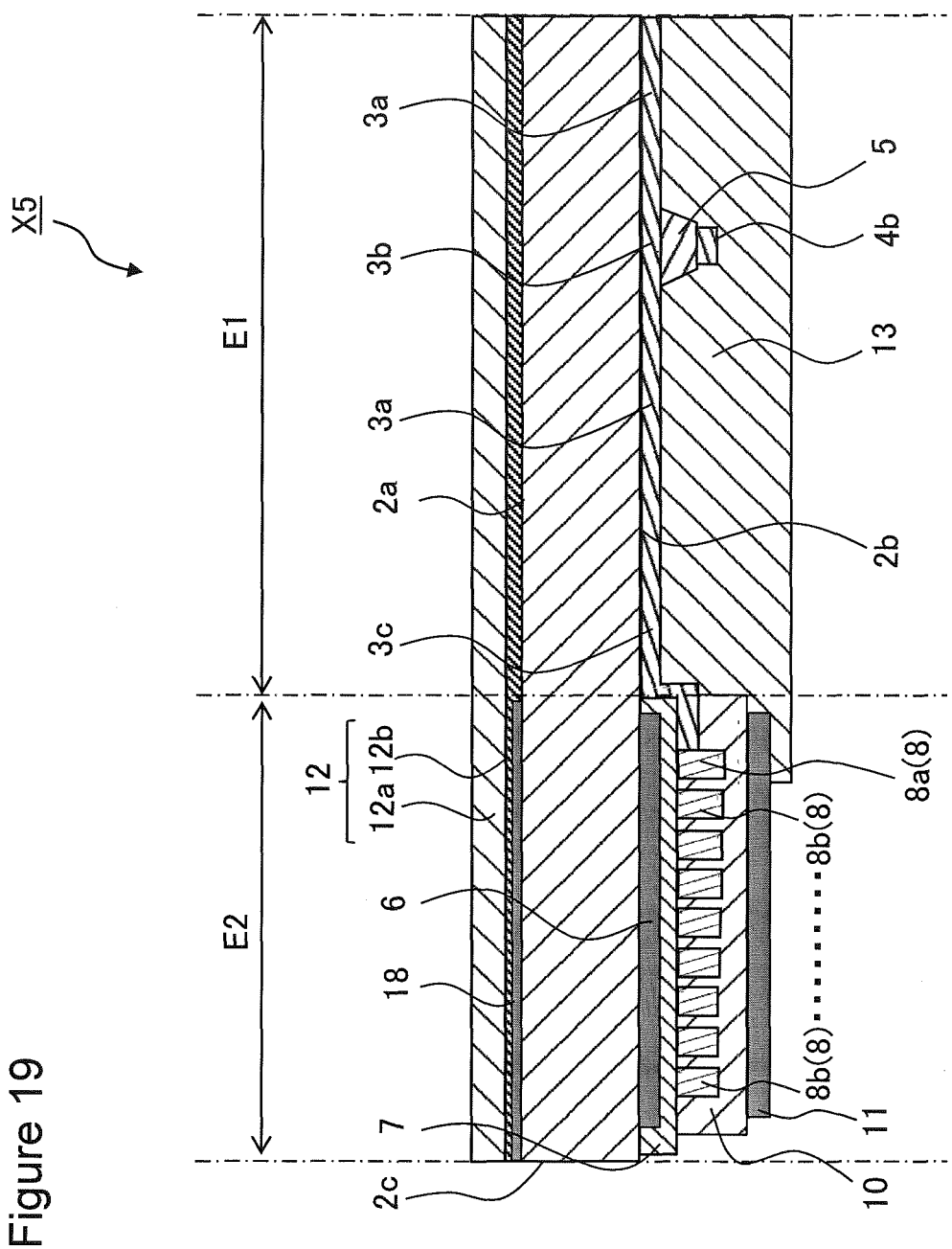
FIG. 19 is a cross-sectional view taken along line VII-VII illustrated in FIG. 18.

FIG. 17 is a plan view illustrating a schematic configuration of an input device X5 according to a modification example 4. FIG. 18 is a plan view illustrating a schematic configuration of the input device X5 according to the modification example 4, and is a view seen through the base 2. FIG. 19 is a cross-sectional view taken along line VII-VII illustrated in FIG. 18. In addition, in FIGS. 17 to 19, configurations having the same function as that in FIGS. 1, 2, and 5 will be given the same reference numerals, and detailed descriptions thereof will be omitted. In addition, in FIG. 18, for ease of description, illustrations of the insulator 5, the first protection member 12, and the second protection member 13 will be omitted.

As illustrated in FIGS. 17 to 19, a decorating layer 18 is further included in the input device X5. The decorating layer 18 is provided on the first main face 2a of the base 2 corresponding to the non-input region E2. Here, the connection portion 8a of the detection wiring 8 is located in a region which overlaps with the detection wiring 8 in plan view. Thus, it is possible to shield light which is input from the second main face 2b side of the base 2, using the first light shielding layer 6, the second light shielding layer 11, and the decorating layer 18 in the non-input region E2. Accordingly, in the input device X5, it is possible to further reduce the possibility that the connection portion 8a of the detection wiring 8 may be viewed by a user, while making the thickness of the first light shielding layer 6 relatively small.

In addition, as in the modification example 1, it is preferable that the base portion 8b also be located in a region which overlaps with the decorating layer 18 in plan view, in addition to the connection portion 8a. When the base portion 8b is located in a region which overlaps with the decorating layer 18 in plan view, it is possible to shield light which is input to the base portion 8b, using the first light shielding layer 6, the second light shielding layer 11, and the decorating layer 18. Accordingly, it is possible to reduce a possibility that the base portion 8b may be viewed by a user.

In addition, as in the modification example 1, it is preferable that the lead-out portion 8c also be located in the region which overlaps with the decorating layer 18 in plan view, in addition to the connection portion 8a. When the lead-out portion 8c is located in the region which overlaps with the decorating layer 18 in plan view, it is possible to shield light which is input to the lead-out portion 8c, using the first light shielding layer 6 and the decorating layer 18. Accordingly, it is possible to reduce a possibility that the lead-out portion 8c may be viewed by a user.

A constituent material and a forming method of the decorating layer 18 are the same as those of the first light shielding layer 6. In addition, as the decorating layer 18, a multilayered evaporated film may be adopted. When the multilayered evaporated film is adopted as the decorating layer 18, it is possible to display various color tones using reflected light or transmitted light in the non-input region E2 of the input device X5, and to improve the design. As the multilayered evaporated film, for example, a laminated structure of a metal oxide film is adopted. In addition, when the multilayered evaporated film is adopted as the decorating layer 18, it is preferable that an antifouling member be provided instead of the first protection member 12.

Modification Example 5

Figure 20:
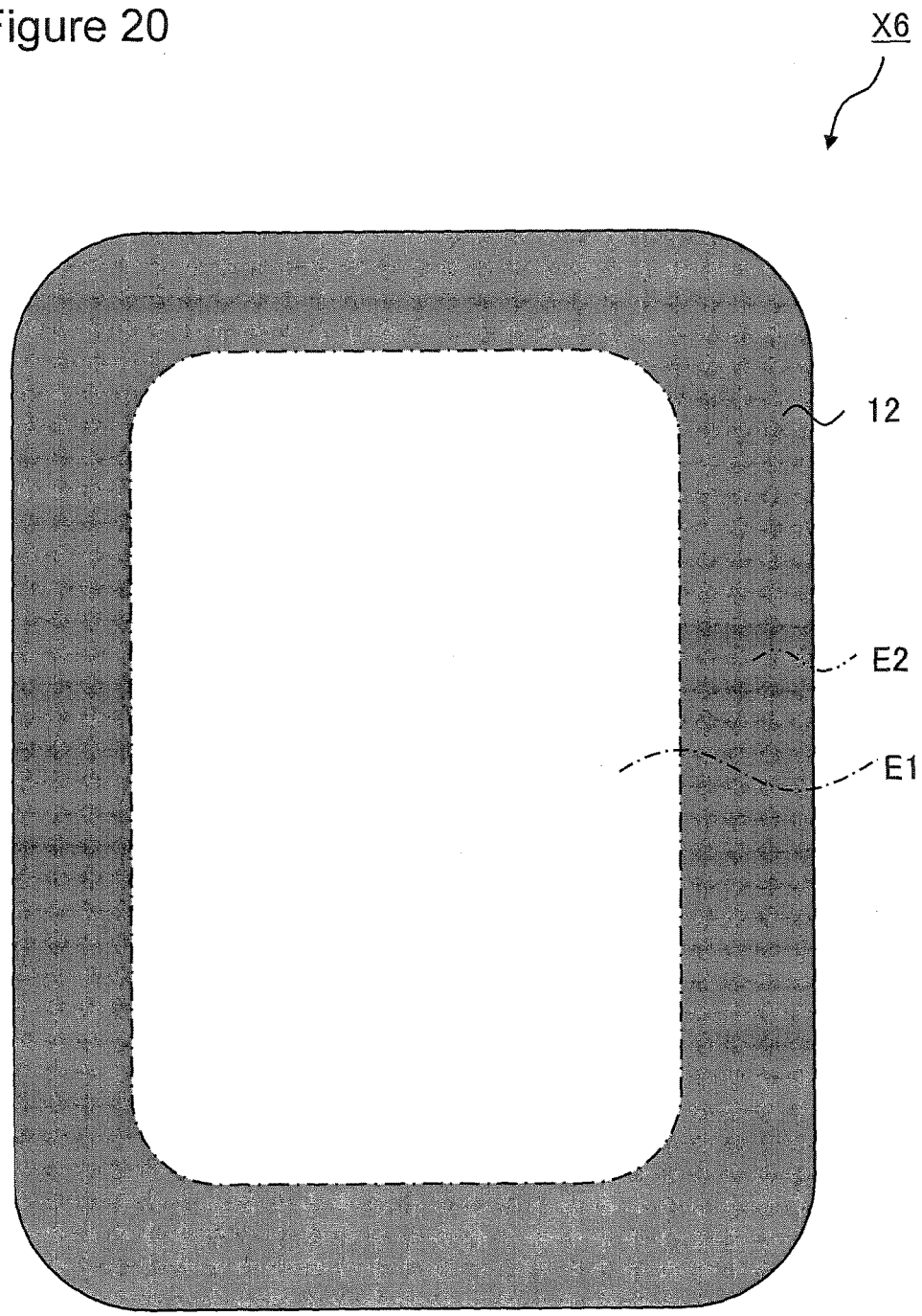
FIG. 20 is a plan view illustrating a schematic configuration of an input device according to modification example 5.
Figure 21:
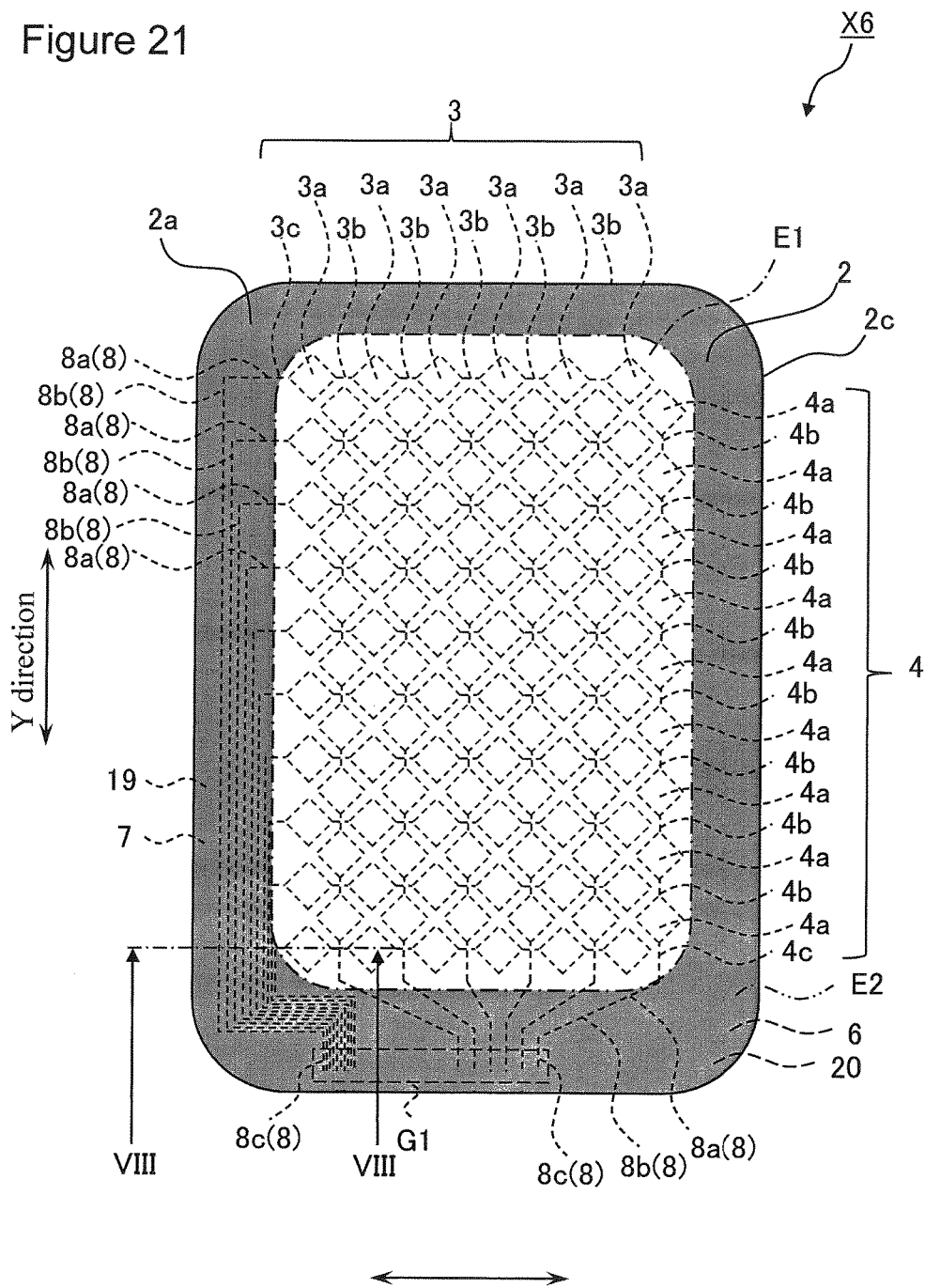
FIG. 21 is a plan view illustrating the schematic configuration of the input device according to the modification example 5, and is a view seen through a base.
Figure 22:
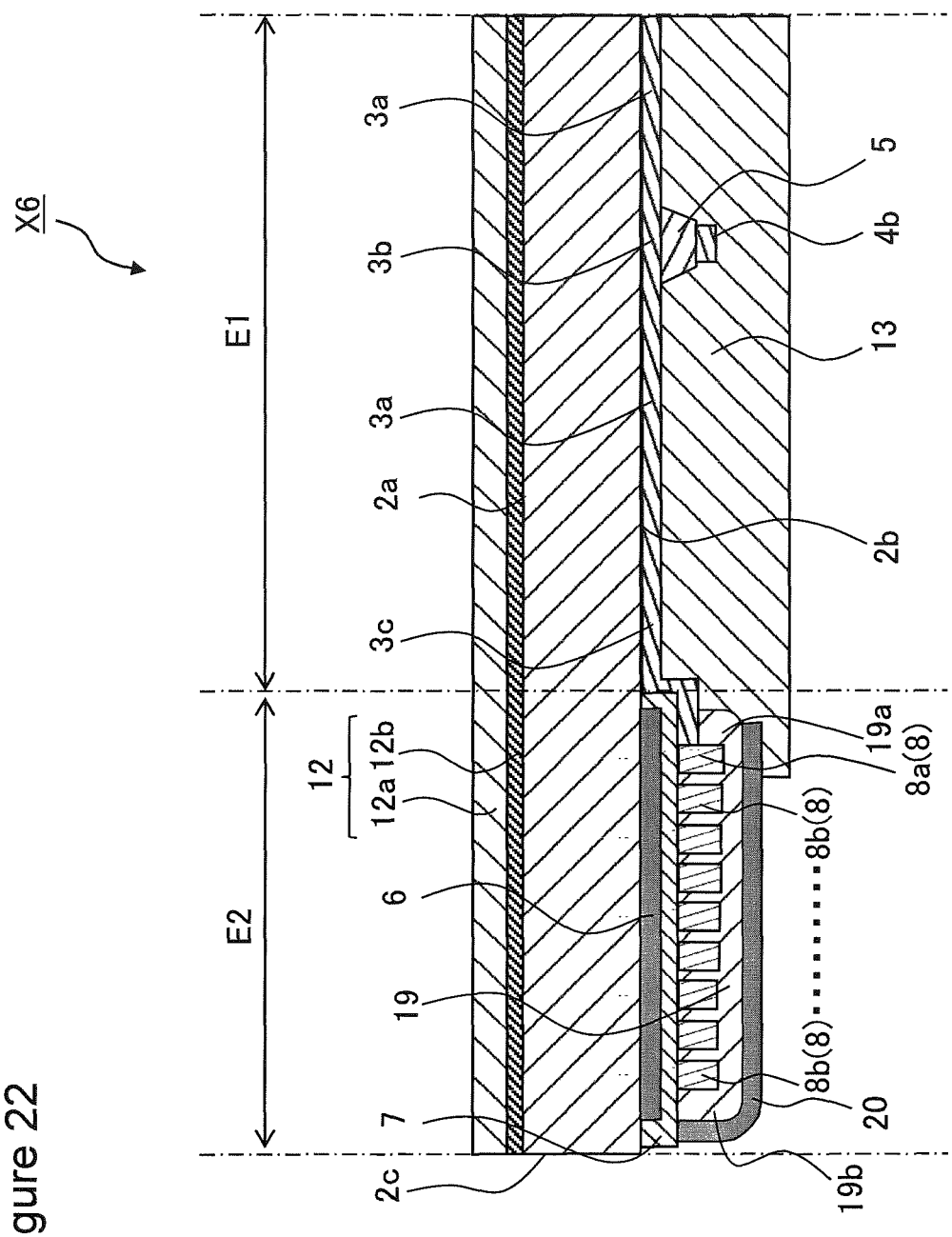
FIG. 22 is a cross-sectional view taken along line VIII-VIII illustrated in FIG. 21.

FIG. 20 is a plan view illustrating a schematic configuration of an input device X6 according to modification example 5. FIG. 21 is a plan view illustrating the schematic configuration of the input device X6 according to modification example 5, and is a view seen through the base 2. FIG. 22 is a cross-sectional view taken along line VIII-VIII illustrated in FIG. 21. In FIGS. 20 to 22, configurations having the same function as that in FIGS. 1, 2, and 5 will be given the same reference numerals, and detailed descriptions thereof will be omitted. In addition, in FIG. 21, for ease of description, illustrations of the insulator 5, the first protection member 12, and the second protection member 13 will be omitted.

As illustrated in FIGS. 20 to 22, a second insulating layer 19 and a second light shielding layer 20 are provided in the input device X6 instead of the second insulating layer 10 and the second light shielding layer 11 which are provided in the input device X1.

The second insulating layer 19 is located on the second main face 2b of the base 2 corresponding to the non-input region E2. The second insulating layer 19 is provided on the first insulating layer 7, and covers the detection wiring 8. In addition, the second insulating layer 19 includes a first end portion 19a which is located on the input region E1 side, and a second end portion 19b which is located on the second end face 2c side of the base 2. The second light shielding layer 20 is provided on the first light shielding layer 6 corresponding to the non-input region E2. Specifically, the second light shielding layer 20 is provided on the second insulating layer 19. Here, the second light shielding layer 20 covers the second end portion 19b of the second insulating layer 19. Accordingly, it is possible to reduce a possibility that the detection wiring 8 is viewed by a user in the input device X6, compared to the input device X1.

In addition, as in the modification example 2, it is preferable that the front surface of the second end portion 19b be a curved surface. When the front surface of the second end portion 19b is the curved surface, it is possible to reduce a possibility that stress is concentrated on the second light shielding layer 20 which is located on the second end portion 19b. Thus, in the input device X6, it is possible to reduce a possibility that peeling off may occur in the second light shielding layer 20 which covers the second end portion 19b when the first main face 2a of the base 2 is repeatedly pressed through the first protection member 12 using the finger F1 of a user.

In addition, as illustrated in FIG. 23, the second light shielding layer 20 may cover a part of the end face 2c of the base 2. When the second light shielding layer 20 covers a part of the end face 2c of the base 2, it is possible to reduce a possibility that a crack or chipping may occur on the base 2. Specifically, the end face 2c of the base 2 is located on the side which is away from the input region E1. Accordingly, there is a possibility that stress may be concentrated on the end face 2c of the base 2, when the first main face 2a of the base 2 corresponding to the input region E1 is repeatedly pressed by the finger F1 of a user through the first protection member 12. In addition, for example, when the input device X6 is incorporated in the display device Y1 instead of the input device X1, there is a possibility that the end face 2c of the base 2 may contact with the first housing 100. That is, the end face 2c of the base 2 is a portion which easily receives a mechanical shock. Therefore, in the input device X6, the second light shielding layer 20 covers a part of the end face 2c of the base 2. Accordingly, it is possible to reduce a possibility that a mechanical shock may be directly added to the end face 2c while suppressing chipping from the end face 2c.

Modification Example 6

In addition, the above described embodiment and modification examples 1 to 5 have been individually described in detail in the specification, however, not limited thereto, and an example in which the above described embodiment and the modification examples 1 to 5 are appropriately combined is also described. That is, the input device according to the present invention is not limited to the input devices X1 to X6, and also includes an input device in which matters in which the above described embodiment and the modification examples 1 to 5 are individually described are appropriately combined.

In addition, the display device Y1 which includes the input device X1 has been described in the embodiment, however, not limited thereto, and the input devices X2 to X6 may be adopted instead of the input device X1.

In addition, the mobile terminal Z1 which includes the input device X1 has been described in the embodiment, however, not limited thereto, and the input devices X2 to X6 may be adopted instead of the input device X1.

REFERENCE SIGNS LIST

X1 TO X6 INPUT DEVICE
Y1 DISPLAY DEVICE
Z1 MOBILE TERMINAL (ELECTRONIC APPARATUS)
2 BASE
3 FIRST DETECTION ELECTRODE PATTERN
4 SECOND DETECTION ELECTRODE PATTERN
6 FIRST LIGHT SHIELDING LAYER
7 FIRST INSULATING LAYER
8 DETECTION WIRING
8a CONNECTION PORTION
8b BASE PORTION
8c LEAD-OUT PORTION
10, 15, 19 SECOND INSULATING LAYER
15a, 19a FIRST END PORTION OF SECOND INSULATING LAYER
15b, 19b SECOND END PORTION OF SECOND INSULATING LAYER
11, 14, 16, 17, 20 SECOND LIGHT SHIELDING LAYER
12 FIRST PROTECTION MEMBER
18 DECORATING LAYER
100 FIRST HOUSING (HOUSING)
200 DISPLAY PANEL

The invention claimed is:

1. An input device comprising:
a base having a first face and a second face opposite the first face, the base comprising:
an input region having a first pair of opposing sides and a second pair of opposing sides perpendicular to the first pair of opposing sides; and
a non-input region surrounding the input region;
a detection electrode pattern disposed on the second face at the input region;
a first insulating layer disposed on and below the second face;
detection wiring, disposed on and below the first insulating layer, and including connection portions, base portions, and lead out portions, wherein the base portions and the connection portions extend from the detection electrode pattern, in a first direction along one of the first pair of opposing sides and a second direction along one of the second pair of opposing sides, to the lead-out portions;
a first light shielding layer disposed on and below the second face of the base and above the detection wiring;
a second insulating layer disposed on and below the first insulating layer and at least on the connection portions in the detection wiring;
a second light shielding layer disposed below and on the second insulating layer, wherein
the first light shielding layer overlaps the second light shielding layer in a plan view, and
the connection portions and the base portions of the detection wiring are located between the first light shielding layer and the second light shielding layer and the base portions are overlapped by the first light shielding layer and the second light shielding layer within the non-input region in the plan view and most of the connection portions are overlapped by the first light shielding layer and the second light shielding layer within the non-input region in the plan view.

2. The input device according to claim 1, wherein
the detection electrode pattern is located in the input region,
the detection wiring, the second insulating layer, the first light shielding layer, and the second light shielding layer are located in the non-input region, and
the second light shielding layer covers a first end portion of the second insulating layer located closer to the input region.

3. The input device according to claim 1, wherein
the detection electrode pattern is located in the input region,
the detection wiring, the second insulating layer, the first light shielding layer, and the second light shielding layer are located in a the non-input region, and
the second light shielding layer covers a second end portion of the second insulating layer located far away from the input region.

4. The input device according to claim 3, wherein
the base has an end face located between the first face and the second face, and
the second insulating layer covers at least a part of the end face.

5. The input device according to claim 1, wherein the second light shielding layer is conductive.

6. The input device according to claim 1, wherein
the connection portions are located closer to the input region than the base portions and the lead-out portions.

7. The input device according to claim 1, further comprising:
a decorating layer on the first face of the base, wherein
at least the connection portions are located in a region which overlaps with the decorating layer in the plan view.

8. The input device according to claim 1, wherein
the base is formed of glass, and
the first light shielding layer is formed of a resin.

9. The input device according to claim 1, wherein
the first light shielding layer and the second light shielding layer have approximately the same shape in the plan view.

10. A display device comprising:
the input device according to claim 1;
a display panel arranged so as to face the input device; and
a housing which accommodates the display panel.

11. An electronic apparatus comprising:
the display device according to claim 10.

* * * * *